United States Patent
Takemoto

(10) Patent No.: US 9,685,977 B1
(45) Date of Patent: Jun. 20, 2017

(54) TIME SERIES DATA COMPRESSING APPARATUS

(71) Applicant: KABUSHIKI KAISHA TOSHIBA, Tokyo (JP)

(72) Inventor: Takashi Takemoto, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/250,861

(22) Filed: Aug. 29, 2016

(30) Foreign Application Priority Data

Mar. 10, 2016 (JP) .................................. 2016-047622

(51) Int. Cl.
H03M 7/30 (2006.01)
H03M 7/42 (2006.01)

(52) U.S. Cl.
CPC ........... H03M 7/42 (2013.01); H03M 7/3073 (2013.01)

(58) Field of Classification Search
CPC ........ H03M 7/30; H03M 7/50; H03M 7/3086; H04N 19/20; H04N 19/543; H04N 19/124; H04N 19/132; H04N 19/54; H04N 19/60; H04N 19/61; H04N 19/63; H04N 19/00; H04N 19/122; H04N 19/136; H04N 19/17
USPC ...... 341/65, 67, 76, 106, 107; 382/106, 167, 382/190–192, 264
See application file for complete search history.

(56) References Cited

U.S. PATENT DOCUMENTS

| 5,696,646 A | * | 12/1997 | Satoh | .................... G11B 5/5547 360/78.04 |
| 6,205,175 B1 | * | 3/2001 | Cho | .......................... G06T 9/20 348/441 |
| 8,867,614 B2 | | 10/2014 | Shiodera et al. | |
| 2001/0003527 A1 | * | 6/2001 | Shinohara | ............... H03M 7/30 370/521 |

(Continued)

FOREIGN PATENT DOCUMENTS

| JP | H04205676 A | 7/1992 |
| JP | H05035861 | 2/1993 |

(Continued)

OTHER PUBLICATIONS

Konstantinos Konstantinides et al., "An Architecture for Lossy Signal Compression", IEEE Workshop on VLSI Signal Processing, Oct. 1992, 6 pages.

(Continued)

Primary Examiner — Linh Nguyen
(74) Attorney, Agent, or Firm — Patterson & Sheridan, LLP

(57) ABSTRACT

A data compressing apparatus includes a polygonal line approximating circuit receiving first time series and outputs second time series by performing a polygonal line approximation process on the first time series. The polygonal line approximating circuit includes a first multiplier and a second multiplier performing multiplication having a first value calculated based on a difference between a time component of first data and a time component of second data in the time series data as input, and a third multiplier and a fourth multiplier performing multiplication having a second value calculated based on a difference between a sensor component of the first data and a sensor component of the second data as input.

20 Claims, 19 Drawing Sheets

(56) References Cited

U.S. PATENT DOCUMENTS

| | | | | |
|---|---|---|---|---|
| 2006/0215917 A1* | 9/2006 | Kimura | ............... | H04N 19/44 |
| | | | | 382/233 |
| 2008/0291295 A1* | 11/2008 | Kato | ............... | H04N 19/124 |
| | | | | 348/231.99 |
| 2013/0151924 A1* | 6/2013 | Beadle | ............... | H04L 69/04 |
| | | | | 714/763 |
| 2016/0142850 A1* | 5/2016 | Borss | ............... | G10L 19/008 |
| | | | | 381/22 |

FOREIGN PATENT DOCUMENTS

| | | | |
|---|---|---|---|
| JP | H05205676 A | 8/1993 | |
| JP | 2940240 B2 | 8/1999 | |
| JP | 5492206 B2 | 5/2014 | |

OTHER PUBLICATIONS

J. J. McKee et al., "Efficient Implementation of FAN/SAPA-2 ECG Compression Methods Using Fixed Point Arithmetic", Automedica, 1994, vol. 16, pp. 109-117.

Ivan Tomek, "Two Algorithms for Piecewise-Linear Continuous Approximation of Functions of One Variable", IEEE Transactions on Computers, Apr. 1974, pp. 445-448.

Eamonn Keogh et al., "Segmenting Time Series: A Survey and Novel Approach", 2004, 15 pages.

\* cited by examiner

FIG. 2A

| T | X(T) |
|---|---|
| 0 | −0.49525 |
| 1 | −0.39766 |
| 2 | −0.30007 |
| 3 | −0.20248 |
| 4 | −0.27656 |
| 5 | −0.05775 |
| ... | ... |
| 31 | −0.13978 |

| T | 100110100010010011... |
|---|---|
| X(T) | 101111010110110011ዐ... |

| T | X(T) |
|---|---|
| 0 | -0.49525 |
| 1 | -0.39766 |
| 4 | -0.27656 |
| 5 | -0.05775 |
| 10 | 0.016467 |
| 11 | 0.071094 |
| 15 | 0.094531 |
| 17 | -0.00306 |
| 25 | -0.07728 |
| 31 | -0.13978 |

FIG. 4B

| dT | dX |
|---|---|
| 1 | 0.09759 |
| 3 | 0.1211 |
| 1 | 0.21881 |
| 5 | 0.074217 |
| 1 | 0.054627 |
| 4 | 0.023437 |
| 2 | -0.09759 |
| 8 | -0.07422 |
| 6 | -0.0625 |

| dT | K=0 PREFIX | K=0 SUFFIX | K=0 CODE LENGTH | K=1 PREFIX | K=1 SUFFIX | K=1 CODE LENGTH | K=2 PREFIX | K=2 SUFFIX | K=2 CODE LENGTH |
|---|---|---|---|---|---|---|---|---|---|
| 1 | 1 | — | 1 | 1 | 0 | 2 | 1 | 00 | 3 |
| 2 | 01 | — | 2 | 1 | 1 | 2 | 1 | 01 | 3 |
| 3 | 001 | — | 3 | 01 | 0 | 3 | 1 | 10 | 3 |
| 4 | 0001 | — | 4 | 01 | 1 | 3 | 1 | 11 | 3 |
| 5 | 00001 | — | 5 | 001 | 0 | 4 | 01 | 00 | 4 |
| 6 | 000001 | — | 6 | 001 | 1 | 4 | 01 | 01 | 4 |
| 7 | 0000001 | — | 7 | 0001 | 0 | 5 | 01 | 10 | 4 |
| 8 | 00000001 | — | 8 | 0001 | 1 | 5 | 01 | 11 | 4 |
| 9 | 000000001 | — | 9 | 00001 | 0 | 6 | 001 | 00 | 5 |
| 10 | 0000000001 | — | 10 | 00001 | 1 | 6 | 001 | 01 | 5 |
| ... | | | | | | | | | |

FIG. 6

| dX | K=0 PREFIX | K=0 SUFFIX | K=0 CODE LENGTH | K=1 PREFIX | K=1 SUFFIX | K=1 CODE LENGTH | K=2 PREFIX | K=2 SUFFIX | K=2 CODE LENGTH |
|---|---|---|---|---|---|---|---|---|---|
| 0 | 1 | - | 1 | 1 | 0 | 2 | 1 | 00 | 3 |
| 1 | 01 | - | 2 | 1 | 1 | 2 | 1 | 01 | 3 |
| -1 | 001 | - | 3 | 01 | 0 | 3 | 1 | 10 | 3 |
| 2 | 0001 | - | 4 | 01 | 1 | 3 | 1 | 11 | 3 |
| -2 | 00001 | - | 5 | 001 | 0 | 4 | 01 | 00 | 4 |
| 3 | 000001 | - | 6 | 001 | 1 | 4 | 01 | 01 | 4 |
| -3 | 0000001 | - | 7 | 0001 | 0 | 5 | 01 | 10 | 4 |
| 4 | 00000001 | - | 8 | 0001 | 1 | 5 | 01 | 11 | 4 |
| -4 | 000000001 | - | 9 | 00001 | 0 | 6 | 001 | 00 | 5 |
| 5 | 0000000001 | - | 10 | 00001 | 1 | 6 | 001 | 01 | 5 |
| ... | | | | | | | | | | ative
TIME SERIES DATA COMPRESSING APPARATUS

CROSS-REFERENCE TO RELATED APPLICATION

This application is based upon and claims the benefit of priority from Japanese Patent Application No. 2016-047622, filed Mar. 10, 2016, the entire contents of which are incorporated herein by reference.

FIELD

Embodiments described herein relate generally to a time series data compressing apparatus.

BACKGROUND

Time series data compressing apparatuses using a polygonal line approximation as a compression technique are known.

DESCRIPTION OF THE DRAWINGS

FIGS. 2A and 2B are diagrams that illustrate one example of data used by the time series data compressing apparatus according to the first embodiment.

FIGS. 4A and 4B are diagrams that illustrate one example of data used in the time series data compressing apparatus according to the first embodiment.

FIG. 5 illustrates one example of a coding table used by the time series data compressing apparatus according to the first embodiment.

FIG. 6 illustrates another example of a coding table used by the time series data compressing apparatus according to the first embodiment.

DETAILED DESCRIPTION

Figure 1:
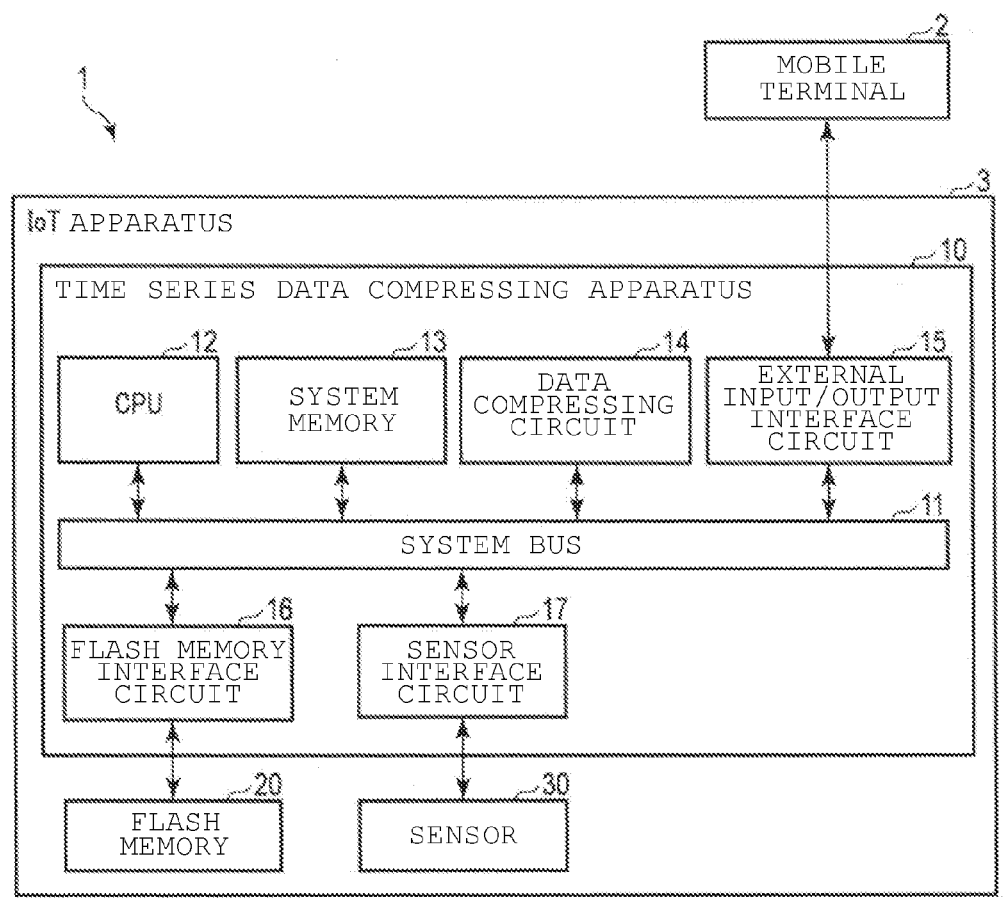
FIG. 1 is a block diagram that illustrates the overall configuration of a time series data compressing system including a time series data compressing apparatus according to a first embodiment.

In general, according to one embodiment, a data compressing apparatus includes a polygonal line approximating circuit configured to receive first time series data and output second time series data by performing a polygonal line approximation process on the first time series data. The polygonal line approximating circuit includes a first multiplier and a second multiplier, each receiving a first value that is a difference between a time value component of first data in the first time series and a time value component of second data in the first time series data. These multipliers respectively multiply the first value by another value corresponding to a determination slope limit for the polygonal line approximation process. The polygonal line approximating circuit also includes a third multiplier and a fourth multiplier, each receiving a second value that is a difference between a sensor value component of the first data and a sensor value component of the second data. These multipliers respectively multiply the second value by another value corresponding to the determination slope limit for the polygonal line approximation process.

Hereinafter, example embodiments will be described with reference to the drawings. In description presented below, a common reference numeral will be attached to elements having the substantially the same function and configuration.

1. First Embodiment

A time series data compressing apparatus according to a first embodiment will be described.

1.1 Configuration
1.1.1 Overall Configuration
An example of the configuration of an overall system including the time series data compressing apparatus according to the first embodiment will be described with reference to FIG. 1. FIG. 1 is a block diagram that illustrates the configuration of a time series data compressing system including the time series data compressing apparatus according to the first embodiment.

As illustrated in FIG. 1, a time series data compressing system 1 includes a mobile terminal 2 and an "Internet of Things" (IoT) apparatus 3.

The mobile terminal 2 is a device capable of wirelessly communicating with the IoT apparatus 3, for example, in compliance with a radio communication standard such as Bluetooth®. The mobile terminal 2 issues a request (data acquisition request) indicating acquisition of data that is compressed to a degree that is communicable using radio communication to the IoT apparatus 3. The mobile terminal 2 receives data generated by the IoT apparatus 3 in response to the data acquisition request.

The IoT apparatus 3 has a function for compressing data (for example, time series data) and transmitting compressed data to the mobile terminal 2 in response to the data acquisition request from the mobile terminal 2. The IoT apparatus 3 includes a time series data compressing apparatus 10, a flash memory 20, and a sensor 30. For example, a combination of the time series data compressing apparatus 10, the flash memory 20, and the sensor 30 may be an integrated semiconductor apparatus, and an example thereof includes an application processor built in to the IoT apparatus 3 and the like. Examples of the IoT apparatus 3 include an IC (integrated circuit) tag used for smart shopping, a wearable terminal, and a digital electronic appliance.

The flash memory 20 includes a plurality of memory cell transistors and stores data in a nonvolatile manner. The flash memory 20 is connected to the time series data compressing apparatus 10 and stores (writes) data supplied from the time series data compressing apparatus 10 therein. The flash memory 20, for example, can be a NOR-type flash memory, but is not limited thereto. Thus, any other type of memory such as a NAND flash memory may be used as the flash memory.

The sensor 30 samples a sensor reading value and supplies sensor reading data in a time series, thereby generating time series data. The sensor 30 is connected to the time series data compressing apparatus 10 and transmits the time series data to the time series data compressing apparatus 10. The sensor 30, for example, is an accelerometer, a gyro sensor, or a geomagnetic sensor and thus may generate time series data relating to acceleration, an angular velocity, or a magnetic field according to sensor type. The sensor 30 is not limited to these example sensor types, and various other sensors, such as a temperature/humidity sensor, a pressure sensor, and an electrocardiographic sensor may be used to generate time series data respectively relating to temperature/humidity, pressure, and a heart rate.

The time series data compressing apparatus 10 generates compressed data by compressing time series data for purposes of transmission to the mobile terminal 2. Here, in this example, the time series data compressing apparatus 10 also transmits the compressed data to the mobile terminal 2. The time series data compressing apparatus 10 includes a system bus 11, a processor (CPU) 12, a system memory 13, a data compressing circuit 14, an external input/output interface circuit 15, a flash memory interface circuit 16, and a sensor interface circuit 17.

The system bus 11 functions as a communication path of various data, commands, and the like among the CPU 12, the system memory 13, the data compressing circuit 14, the external input/output interface circuit 15, the flash memory interface circuit 16, and the sensor interface circuit 17.

The CPU 12 controls the overall operation of the time series data compressing apparatus 10. When a data acquisition request is received from the mobile terminal 2, the CPU 12 issues a command for generating compressed data to the data compressing circuit 14, which generates the compressed data by compressing the time series data. Once the compressed data is generated, the CPU 12 issues a command for transmitting the compressed data to the mobile terminal 2 to the external input/output interface circuit 15. In addition, the CPU 12, for example, may also issue a command for writing the compressed data into the flash memory 20.

The system memory 13 is a semiconductor memory such as a DRAM and is used as a temporary storage area of time series data from the sensor 30 and compressed data from the data compressing circuit 14. In addition, the system memory 13, for example, maintains firmware used for managing the flash memory 20 and the like.

The data compressing circuit 14, for example, operates based on a built-in clock. In response to a command indicating the generation of compressed data issued from the CPU 12, the data compressing circuit 14 reads time series data stored in the system memory 13 and generates compressed data based on the time series data. The data compressing circuit 14 then stores the just generated compressed data in the system memory 13.

The external input/output interface circuit 15 is responsible for radio communication between the time series data compressing apparatus 10 and the mobile terminal 2. For example, a radio communication standard such as Bluetooth® may be used for the radio communication between the time series data compressing apparatus 10 and the mobile terminal 2. The external input/output interface circuit 15 transmits the data acquisition request received from the mobile terminal 2 to the CPU 12 through the system bus 11. In addition, in response to a command transmitted from the CPU 12, the external input/output interface circuit 15 transmits the compressed data stored in the system memory 13 to the mobile terminal 2 through the system bus 11.

The flash memory interface circuit 16 is connected to the flash memory 20, for example, through a flash memory bus and is responsible for communication between the time series data compressing apparatus 10 and the flash memory 20. The flash memory interface circuit 16 transmits a command received from the CPU 12 to the flash memory 20. In addition, the flash memory interface circuit 16 transmits data for recording, which has been previously stored inside the system memory 13, to the flash memory 20 at a time of recording data. Furthermore, the flash memory interface circuit 16 transmits data read from the flash memory 20 to the system memory 13 through the system bus 11 at a time of reading data.

The sensor interface circuit 17 is connected to the sensor 30, for example, through a serial bus and is responsible for the communication between the time series data compressing apparatus 10 and the sensor 30. The sensor interface circuit 17 transmits time series data transmitted from the sensor 30 to the system memory 13 through the system bus 11.

FIGS. 2A and 2B are diagrams that each illustrate one example of data used by the time series data compressing apparatus according to the first embodiment. FIG. 2A illustrates one example of time series data, and FIG. 2B illustrates one example of compressed data which might result from compressing time series data.

As illustrated in FIG. 2A, as the time series data 100a, sets of two-dimensional coordinate data (T, X(T)) in which time data T and sensor data X(T) acquired at time represented by the time data T are associated with each other are aligned in a time series, for example, in the ascending order. In the example illustrated in FIG. 2A, while the time series data 100a includes coordinate data of 32 points from time 0 to time 31, the time series data is not limited thereto but may include coordinate data of an arbitrary number such as 16 points or 64 points. The time data T, for example, is an integer value and may be an index value corresponding to the particular sensor data X(T). The sensor data X(T), for example, has a real number value and with the number of bits being larger than the time data T. For example, the sensor data X(T) is output as data of which the number of bits is 16 bits or 24 bits.

As illustrated in FIG. 2B, the compressed data 100b includes a set of a bit string including information relating to the time data T and a bit string corresponding to information relating to the sensor data X(T). Each bit string is generated, for example, by performing independent coding.

1.1.2 Configuration of Data Compressing Circuit

Figure 3:
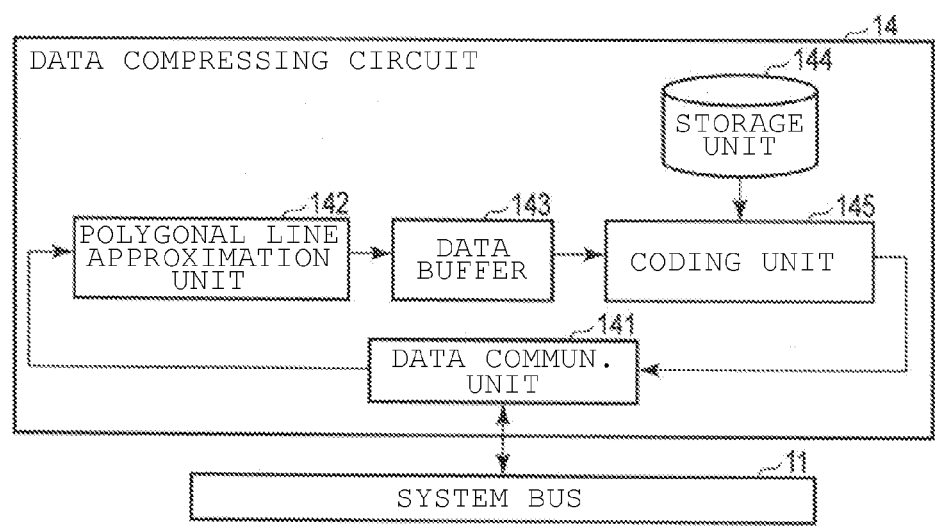
FIG. 3 is a block diagram that illustrates the configuration of the time series data compressing apparatus according to the first embodiment.

Next, the configuration of the data compressing circuit of the time series data compressing apparatus according to the first embodiment will be described with reference to FIG. 3. FIG. 3 is a block diagram that illustrates the configuration of the data compressing circuit of the time series data compressing apparatus according to the first embodiment.

As illustrated in FIG. 3, the data compressing circuit includes: a communication unit 141; a polygonal line approximating unit 142, also referred to herein as a polygonal line approximating circuit; a data buffer 143; a storage unit 144; and a coding unit 145, also referred to herein as a coding circuit.

The communication unit 141, for example, is a directed memory access controller (DAMC) and receives the command for compressing time series data that is issued from the CPU 12. The communication unit 141, for example, reads time series data stored inside the system memory 13 through the system bus 11 in response to the command. The communication unit 141 transmits the read time series data to the polygonal line approximating unit 142. In addition, when compressed data is eventually received from the coding unit 145, the communication unit 141 transmits this compressed data to the system memory 13.

When time series data is received from the communication unit 141, the polygonal line approximating unit 142 performs a polygonal line approximating process on the received time series data. More specifically, the polygonal line approximating unit 142 determines whether each coordinate data included in the time series data is coordinate data (polygonal line vertex coordinate data) that is a vertex of a polygonal line. The polygonal line approximating unit 142 extracts coordinate data determined as polygonal line vertex coordinate data as a result of this determination and sequentially outputs the extracted polygonal line vertex coordinate data to the data buffer 143. The polygonal line approximating process performed by the polygonal line approximating unit 142 will be described later in detail.

The data buffer 143 stores the pieces of polygonal line vertex coordinate data sequentially output by the polygonal line approximating unit 142. The data buffer 143, for example, stores polygonal line vertex coordinate data of a number determined in advance as time series data after the polygonal line approximation of one block. The time series data after the polygonal line approximation includes a portion that is coordinate data included in the time series data as polygonal line vertex coordinate data and, for example, the polygonal line vertex coordinate data is aligned in the ascending order of time therein. In addition, polygonal line vertex coordinate data of an arbitrary number such as 10 points, 16 points, 32 points, or 64 points may be included in the time series data after the polygonal line approximation of one block.

The storage unit 144 is a memory that to which data can be read/written from/into the coding unit 145. In the storage unit 144, a plurality of coding tables is stored in advance. Each of the coding tables is read in accordance with a coding process performed by the coding unit 145. In addition, the storage unit 144 may store the compressed data transmitted from the coding unit 145 therein.

When polygonal line vertex coordinate data corresponding to one block has been stored in the data buffer 143 as time series data after the polygonal line approximation, the coding unit 145 reads this stored time series data from the data buffer 143. When the stored time series data is read from the data buffer 143, the coding unit 145 next generates coding target data based on this time series data (after the polygonal line approximation). The coding target data, for example, is a set of predicted error data between adjacent data in the time series output from the polygonal line approximating unit 142. The coding unit 145 reads a coding table that has been stored in the storage unit 144 and performs a coding process based on the stored coding table to generate the coding target data. A variable-length coding system can be applied to the coding process. More specifically, while a variable-length coding system, for example, using Golomb coding can be applied to the coding process, the coding system is not limited to the Golomb coding type. Thus, any variable-length coding system using various codes may be applied to the coding process. In addition, the coding unit 145 performs an independent coding process for the portion of the time series data that corresponds to time data and the portion that corresponds to sensor data. The coding unit 145 transmits a set of bit strings generated as a result of the coding process(es) to the communication unit 141 as compressed data. In addition, the coding unit 145 may write the compressed data into the storage unit 144.

FIGS. 4A and 4B are diagrams that illustrate one example of data which might be used in the time series data compressing apparatus according to the first embodiment. FIG. 4A illustrates one example of time series data after the polygonal line approximation, and FIG. 4B illustrates one example of coding target data.

As illustrated in FIG. 4A, the time series data 100c after the polygonal line approximation includes only coordinate data extracted as polygonal line vertex coordinate data from among the coordinate data included in the time series data 100a. In the example illustrated in FIG. 4A, coordinate data for a total of 10 points of time 0, time 1, time 4, time 5, time 10, time 11, time 15, time 17, time 25, and time 31 (from among time 0 to time 31 of the original time series data 100a) is included as the polygonal line vertex coordinate data. In other words, the time series data 100c after the polygonal line approximation is an example in which polygonal line vertex coordinate data of 10 points has been extracted from the time series data 100a (which was 32 points) as one block.

As illustrated in FIG. 4B, coding target data 100d, for example, is generated as a difference between adjacent polygonal line vertex coordinate data included in the time series data 100c. In the coding target data 100d, a data set (dT, dX) including time prediction error data dT and sensor prediction error data dX is aligned. The coding target data 100d is generated in correspondence with the time series data 100c after the polygonal line approximation. In the example illustrated in FIG. 4B, the coding target data 100d includes coordinate data of 9 points, which is one point less than the time series data 100c including coordinate data of 10 points. The time prediction error data dT, similar to the time data T, has an integer value. The sensor prediction error data dX, similar to the sensor data X(T), has a real number value and the number of bits is larger than the time prediction error data dT. For example, the sensor prediction error data dX, similar to the sensor data X(T) is output as data of which the number of bits is 16 bits or 24 bits.

FIG. 5 is a diagram that illustrates one example of a coding table corresponding to the time prediction error data dT from among coding tables which can be applied in the time series data compressing apparatus according to the first embodiment. FIG. 6 is a diagram that illustrates one example of a coding table corresponding to the sensor prediction error data dX from among the coding tables which can be applied in the time series data compressing apparatus according to the first embodiment. The coding table 200a and coding table 200b illustrated in FIGS. 5 and 6, respectively, represent coding tables of a Golomb coding.

As illustrated in FIG. 5, the coding table 200a includes: a value of the time prediction error data dT; a bit string, which is particularly assigned to the value of the time prediction error data dT, as a result of the coding; and a code length for the assigned bit string.

In a case where the time data T has an integer value, the value of the time prediction error data dT can be a positive integer, and these integers are aligned in the ascending order in the table. The bit string and the code length are assigned to the value of the particular time prediction error data dT in accordance with a value of a parameter K (here, K is an integer greater or equal to zero). In the example illustrated in FIG. 5, in a case where the value of the time prediction error data dT is 7, when "0" is selected as the parameter K, a bit string "0000001" having a code length "7" is assigned, and, when "2" is selected as the parameter K, a bit string "0110" having a code length "4" is assigned. In other words, the coding table 200a has different coding patterns corresponding to the different values of the parameter K.

In addition, the bit string can be divided into a prefix and a suffix. The prefix corresponds to a first half of the bit string, and, as the value of the time prediction error data dT increases, the code length thereof is increased. With respect to the prefix, as the value of the parameter K increases, the same prefix is assigned, and the range of the time prediction error data dT is increased. On the other hand, the suffix corresponds to a second half of the bit string and can be used to discriminate between time prediction error data dT to which the same prefix is assigned. As the value of the parameter K increases, the code length of the suffix increases correspondingly.

In other words, the Golomb coding illustrated in the coding table 200a, can code a set of the time prediction error data dT included in the coding target data into a short bit string when the values of the time prediction error data dT included in the coding target data are distributed in a range close to zero.

As illustrated in FIG. 6, the coding table 200b includes: a value of the sensor prediction error data dX; a bit string, which is assigned to the particular value of the sensor prediction error data dX, as a result of the coding; and a code length of the assigned bit string. The coding table 200b is the same as the coding table 200a illustrated in FIG. 5 except that a corresponding value of the sensor prediction error data dX is coded instead the time prediction error data dT. The corresponding values of the sensor prediction error data dX, can be for example, zero, a positive integer, or a negative integer, but these values are aligned in the table in the ascending order of absolute value. The corresponding value of the sensor prediction error data dX used with the coding table 200b corresponds, for example, to a value acquired by dividing the sensor prediction error data dX by the resolution of the sensor data X(T). The method of setting the correspondence relation between the sensor prediction error data dX and the corresponding value of the sensor prediction error data dX used in the coding is not limited to the method described above, and any other setting method may be used.

1.1.3 Details of Functional Configuration of Polygonal Line Approximating Unit

Next, details of the functional configuration of the polygonal line approximating unit of the time series data compressing apparatus according to the first embodiment will be described.

1.1.3.1 Function of Polygonal Line Approximating Unit

Figure 7:
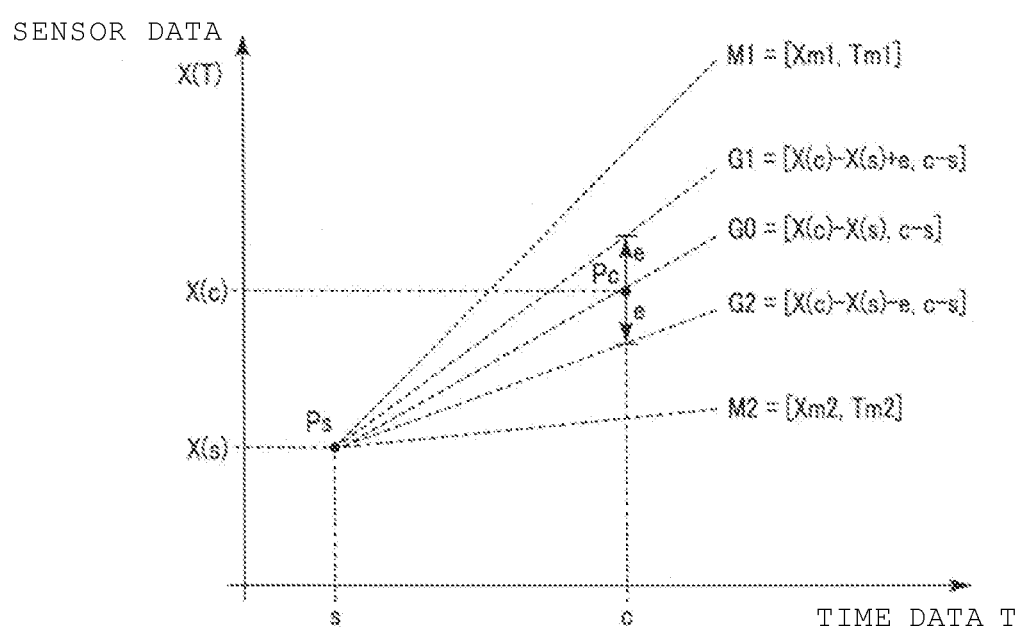
FIG. 7 is a schematic diagram that illustrates a polygonal line vertex coordinates determining function of the time series data compressing apparatus according to the first embodiment.

FIG. 7 is a schematic diagram that illustrates one example of a polygonal line vertex coordinates determining function of the time series data compressing apparatus according to the first embodiment. As illustrated in FIG. 7, in the polygonal line approximating process evaluation coordinates Pc(c, X(c)) and reference coordinates Ps(s, X(s)) are defined for the time series data to be compressed. The evaluation coordinates Pc, for example, are coordinate data that is an evaluation target for extracting polygonal line vertex coordinate data from among coordinate data included in the time series data and thus include time data c and sensor data X(c). The reference coordinates Ps, for example, are nearest coordinate data determined as polygonal line vertex coordinate data on the past side (data point from an earlier time in the time series) of the evaluation coordinates Pc and will include time data s and sensor data X(s).

The polygonal line approximating unit 142, for example, includes the following seven functions for extracting polygonal line vertex coordinate data.

Function (1-1): a function for setting information G0 representing the slope (evaluation value G0) of a line segment joining the evaluation coordinates Pc and the reference coordinates Ps, information (error upper limit value) G1 representing an allowable error upper limit value of the evaluation value, information (error lower limit value) G2 representing an allowable error lower limit value of the evaluation value G0, information (determination upper limit value) M1 representing an upper limit value for the slope for the polygonal line determination, and information (determination lower limit value) M2 representing a lower limit value for the slope for the polygonal line determination.

Function (1-2): a function for determining whether a particular evaluation value is below the upper limit value of the slope for the polygonal line determination (Determination 1-2) based on the evaluation information G0 and the determination upper limit information M1.

Function (1-3): a function for determining whether the particular evaluation value is above the lower limit value of the slope for the polygonal line determination (Determination 1-3) based on the evaluation information G0 and the determination lower limit information M2.

Function (1-4): a function for extracting coordinate data P(c−1) of a time prior to the time corresponding to the evaluation coordinates Pc as polygonal line vertex coordinate data in a case where one of the results of Determination (1-2) or Determination (1-3) is "No".

Function (1-5): a function for determining whether the allowable error upper limit value of the particular evaluation value is below the upper limit value of the slope for the polygonal line determination (Determination 1-5) based on the error upper limit information G1 and the determination upper limit information M1.

Function (1-6): a function for determining whether the allowable error lower limit value of the particular evaluation value is above the lower limit value of the slope for the polygonal line determination (Determination 1-6) based on the error lower limit information G2 and the determination lower limit information M2.

Function (1-7): a function for updating the determination upper limit information M1 with the error upper limit information G1 in a case where a result of Determination (1-5) is "Yes" and updating the determination lower limit information M2 with the error lower limit information G2 in a case where a result of Determination (1-6) is "Yes".

The error upper limit information G1 and the error lower limit information G2 respectively represent information of an upper limit and information of a lower limit of the evaluation information G0 in a case where there is an allowed (or expected) error value e (here, e is a real number value) in the sensor data X(c) of the evaluation coordinates Pc in the example illustrated in FIG. 7. As the determination upper limit information M1, for example, the error upper limit information G1 representing a steepest permissible slope between the reference coordinates Ps and the evaluation coordinates Pc is used. In addition, as the determination lower limit information M2, for example, the error lower limit information G2 representing a shallowest permissible slope between the reference coordinates Ps and the evaluation coordinates Pc is used.

In addition, the allowed error value e is a value set in advance of performing a polygonal line approximating process, and, for example, a same value may be used during the polygonal line approximating process for all the time series data of same type. However, the allowed error value e may also be a fixed value or may be changed for each time series data.

As an example of a polygonal line approximating process algorithm used for the polygonal line approximating process having the functions described above, there is an algorithm described in a reference #1: McKee, J. J., Evans, N. E., & Owens, F. J., "Efficient implementation of the Fan/SAPA-2 algorithm using fixed point arithmetic", Automedica. Vol. 16, pp. 109-117. 1994. This reference is hereby incorporated in its entirety with respect to algorithms for polygonal line approximating processes.

In a polygonal line approximating process algorithm used for the polygonal line approximating unit according to the first embodiment, the evaluation information G0, the error upper limit information G1, the error lower limit information G2, the determination upper limit information M1, and the determination lower limit information M2 are defined not as scalar values but as two-dimensional vectors with values corresponding to line slopes. For example, the evaluation information G0, the error upper limit information G1, the error lower limit information G2, the determination upper limit information M1, and the determination lower limit information M2 are defined as two-dimensional vectors in a homogeneous coordinate system. The homogeneous coordinate system is a coordinate system in which, for example, in a case where the slope α of a segment is represented in a fractional representation like α=x/t, information representing the slope α is represented as coordinates [x, t] having a first element as a numerator x and having a second element as a denominator t. In description presented below, it is assumed that a polygonal line approximating process algorithm acquired by applying the homogeneous coordinate system described above to the algorithm disclosed in the reference #1 is used.

In other words, according to the polygonal line approximating process algorithm of the first embodiment, the evaluation information G0, the error upper limit information G1, and the error lower limit information G2 are represented as below:

$G0=[X(c)-X(s),c-s]$ $G1=[X(c)-X(s)+e,c-s]$ $G2=[X(c)-X(s)-e,c-s]$

In addition, for the convenience of description, the determination upper limit information M1 and the determination lower limit information M2 are represented as below:

$M1=[Xm1,Tm1]$ $M2=[Xm2,Tm2]$

In addition, Function (1-2), Function (1-3), Function (1-5), and Function (1-6) are achieved by a configuration capable of performing the following Determination (1-2), Determination (1-3), Determination (1-5), and Determination (1-6).

Determination (1-2):

$G0 \times M1=(X(c)-X(s)) \cdot Tm1-(c-s) \cdot Xm1 < 0$

Determination (1-3):

$G0 \times M2=(X(c)-X(s)) \cdot Tm2-(c-s) \cdot Xm2 > 0$

Determination (1-5):

$G1 \times M1=(X(c)-X(s)+e) \cdot Tm1-(c-s) \cdot Xm1 < 0$

Determination (1-6):

$G2 \times M2=(X(c)-X(s)-e) \cdot Tm2-(c-s) \cdot Xm2 > 0$

Here, an operation symbol "×" is a symbol that represents an outer product operation of two-dimensional vectors.

In this way, in the time series data compressing apparatus 10 according to the first embodiment, each of Function (1-2), Function (1-3), Function (1-5), and Function (1-6) can be achieved by a configuration including only two multipliers, each capable of performing one outer product operation, in other words, by performing multiplication twice.

1.1.3.2 Configuration of Polygonal Line Approximating Unit

Figure 8:
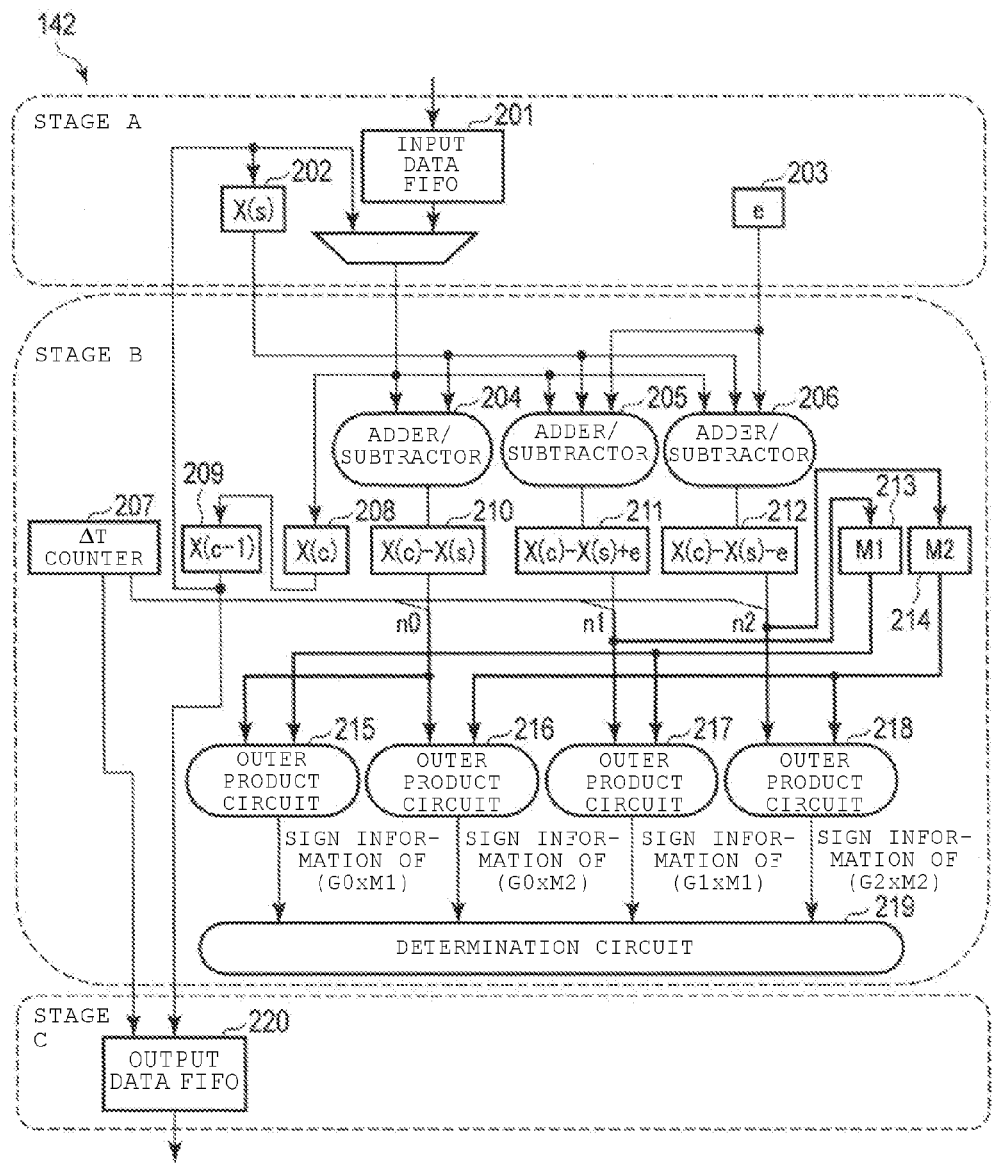
FIG. 8 is a circuit diagram that illustrates the configuration of a polygonal line approximating unit of the time series data compressing apparatus according to the first embodiment.

FIG. 8 is a circuit diagram that illustrates one example of the configuration of the polygonal line approximating unit 142 of the time series data compressing apparatus according to the first embodiment. As illustrated in FIG. 8, the polygonal line approximating unit 142 has a pipeline structure including pipelines of three stages: Stage A, Stage B, and Stage C.

Stage A includes input data FIFO (First In First Out) module 201 and registers 202 and 203. Stage A is a pipeline in which values used for an operation process and a determination process in Stage B are set by the input data FIFO module 201 and the registers 202 and 203.

Stage B includes adder/subtractor units 204, 205, and 206, a ΔT counter 207, registers 208 to 214, outer product circuits 215 to 218, and a determination circuit 219. Stage B is a pipeline in which operation processes are performed by the adder/subtractor units 204 to 206 and the outer product circuits 215 to 218 and determination processes including Determinations (1-2) and (1-3) and Determinations (1-5) and (1-6) are performed by the determination circuit 219 recursively based on values set in Stage A.

Stage C includes output data FIFO module 220. Stage C is a pipeline from which polygonal line vertex coordinate data based on the determination processes performed in Stage B is output.

The input data FIFO module 201 receives time series data from the communication unit 141 and maintains this received time series data. The input data FIFO module 201 outputs sensor data X(T) included in the time series data in the ascending order of the corresponding time data T. More specifically, in a case where both the results of Determination (1-2) and Determination (1-3) are determined to be "Yes" by the determination circuit 219, and there is time series data inside the input data module FIFO module 201, the input data FIFO module 201 outputs the next sensor data X(T) in the ascending order of time (T). The sensor data X(T) is output to the register 208 and the adder/subtractor units 204 to 206 as sensor data X(c) corresponding to the evaluation coordinates Pc.

The register 202 receives sensor data X(T) from the register 209. When the sensor data X(T) is received, the register 202 maintains this sensor data X(T) as the sensor data X(s) corresponding to the reference coordinates Ps. The register 202 outputs the maintained sensor data X(s) to the adder/subtractor units 204 to 206.

The register 203 maintains the allowed error value e, established here in advance of processing. The register 203 outputs the maintained allowed error value e to the adder/subtractor units 205 and 206.

The adder/subtractor unit 204 receives the sensor data X(c) from the input data FIFO module 201 and the sensor data X(s) from the register 202 as a first input value and a second input value, respectively. The adder/subtractor unit 204 subtracts the second input value from the first input value and outputs a value (X(c)−X(s)) to the register 210.

The adder/subtractor unit 205 receives the sensor data X(c) from the input data FIFO module 201, the sensor data X(s) from the register 202, and the allowed error value e from the register 203 as a first input value, a second input value, and a third input value, respectively. The adder/subtractor unit 205 operates to subtract the second input value from the first input value and to add the third input value to the subtraction result and thus outputs a value (X(c)−X(s)+e) to the register 211.

The adder/subtractor unit 206 receives the sensor data X(c) from the input data FIFO module 201, the sensor data X(s) from the register 202, and the allowed error value e from the register 203 as a first input value, a second input value, and a third input value, respectively. The adder/subtractor unit 205 operates to subtract the second input value from the first input value and to subtract the third input value from the previous subtraction result and thus outputs a value (X(c)−X(s)−e) to the register 212.

The $\Delta T$ counter 207 maintains the time data c and (c−1) and a value (c−s) based on time data c corresponding to the sensor data X(c) maintained in the register 208 and time data s corresponding to the sensor data X(s) maintained in the register 202.

The $\Delta T$ counter 207 outputs the stored value (c−s) to nodes n0, n1, and n2. In a case where both results of Determination (1-2) and Determination (1-3) are determined to be "Yes" by the determination circuit 219, and there is time series data still to be output that is stored inside the input data FIFO module 201, the $\Delta T$ counter 207 then counts up (increments) the time data c and (c−1) and the value (c−s) by one. On the other hand, in a case where both results of Determination (1-2) and Determination (1-3) are determined to be "Yes" by the determination circuit 219, and there is no time series data still to be output stored inside the input data FIFO module 201, the $\Delta T$ counter 207 outputs the maintained time data c to the output data FIFO module 220. In addition, in a case where one of results of Determination (1-2) and Determination (1-3) is determined to be No by the determination circuit 219, the $\Delta T$ counter 207 outputs the stored time data (c−1) to the output data FIFO module 220 and updates (increments) the stored value (c−s) by a 1.

The register 208 receives sensor data X(c) from the input data FIFO module 201 and maintains this received sensor data X(c). In a case where both results of Determination (1-2) and Determination (1-3) are determined to be "Yes" by the determination circuit 219, the register 208 outputs the stored sensor data X(c) to the register 209. In addition, in a case where both results of Determination (1-2) and Determination (1-3) are determined to be "Yes" by the determination circuit 219, and there is time series data still to be output stored inside the input data FIFO module 201, the register 208 receives sensor data X(c+1) that is newly output from the input data FIFO module 201 and updates the stored value after the previously sensor data X(c) has been output to the register 209.

Until the next sensor data X(c) has been received from the register 208, the register 209 maintains sensor data X(c−1) from the previous time. In a case where one of the results of Determination (1-2) and Determination (1-3) is determined to be No by the determination circuit 219, the register 209 outputs the stored sensor data X(c−1) to the register 202 and the output data FIFO module 220.

On the other hand, in a case where both results of Determination (1-2) and Determination (1-3) are determined to be "Yes" by the determination circuit 219, the register 209 receives the sensor data X(c) from the register 208 and updates its stored value. In a case where both the results of Determination (1-2) and Determination (1-3) are determined to be "Yes" by the determination circuit 219, and there is no time series data to be output inside the input data FIFO module 201, the register 209 outputs the sensor data X(c) that is maintained according to the update to the output data FIFO module 220.

The register 210 receives a value (X(c)−X(s)) from the adder/subtractor unit 204 and maintains this received value. The register 210 outputs this maintained value (X(c)−X(s)) to the node n0.

The value (c−s) transmitted from the $\Delta T$ counter 207 and the value (X(c)−X(s)) transmitted from the register 210 are input to the node n0. At the node n0, the input values are integrated as evaluation information G0=[X(c)−X(s), c−s], that is a vector of a homogeneous coordinate system, and this evaluation information is provided to the outer product circuits 215 and 216.

The register 211 receives the value (X(c)−X(s)+e) from the adder/subtractor unit 205 and maintains this received value. The register 211 outputs this maintained value (X(c)−X(s)+e) to the node n1.

The value (c−s) transmitted from the $\Delta T$ counter 207 and the value (X(c)−X(s)+e) transmitted from the register 211 are input to the node n1. At the node n1, the input values are integrated as error upper limit information G1=[X(c)−X(s)+e, c−s], that is a vector of a homogeneous coordinate system, and this error upper limit information is provided to the outer product circuit 217. In addition, in a case where both results of Determination (1-2) and Determination (1-3) acquired by the determination circuit 219 are "Yes", and the result of Determination (1-5) is "No", the error upper limit information G1 is output to the register 213.

The register 212 receives the value (X(c)−X(s)−e) from the adder/subtractor unit 206 and maintains this received value. The register 212 outputs this maintained value (X(c)−X(s)−e) to the node n2.

The value (c−s) transmitted from the $\Delta T$ counter 207 and the value (X(c)−X(s)−e) transmitted from the register 212 are input to the node n2. At the node n2, these input values are integrated as error lower limit information G2=[X(c)−X(s)−e, c−s], that is a vector of a homogeneous coordinate system, and this error lower limit information is provided to the outer product circuit 218. In addition, in a case where both results of Determination (1-2) and Determination (1-3) acquired by the determination circuit 219 are "Yes", and the result of Determination (1-6) is "No", the error lower limit information G2 is output to the register 214.

The register 213 maintains the determination upper limit information M1. The register 213 outputs this maintained determination upper limit information M1 to the outer product circuits 215 and 217.

More specifically, in a case where the results of Determination (1-2) and Determination (1-3) as determined by the determination circuit 219 are "Yes", and the result of Determination (1-5) is also "Yes", the register 213 updates its stored determination upper limit information M1 using the error upper limit information G1 output from the node n1. On the other hand, in a case where one of the results of Determination (1-2) and Determination (1-3) as determined by the determination circuit 219 is "No", the register 213 updates its stored determination upper limit information M1 to be M1=[1, 0].

The register 214 maintains the determination lower limit information M2. The register 214 outputs this maintained determination lower limit information M2 to the outer product circuits 216 and 218.

More specifically, in a case where both results of Determination (1-2) and Determination (1-3) determined by the determination circuit 219 are "Yes", and the result of Determination (1-6) is "Yes", the register 214 updates its stored determination lower limit information M2 with the error lower limit information G2 output from the node n2. On the other hand, in a case where one of the results of Determination (1-2) and Determination (1-3) determined by the determination circuit 219 is "No", the register 214 updates its stored determination lower limit information M2 to be M2=[−1, 0].

The outer product circuit 215 receives the evaluation information G0 output from the node n0 and the determination upper limit information M1 output from the register 213 respectively as a first input vector and a second input vector and performs an outer product operation on the first input vector and the second input vector. The outer product circuit 215 outputs information (sign information of G0×M1) indicating whether an outer product value for G0×M1 is negative to the determination circuit 219.

The outer product circuit 216 receives the evaluation information G0 output from the node n0 and the determination lower limit information M2 output from the register 214 respectively as a first input vector and a second input vector and performs an outer product operation on the first input vector and the second input vector. The outer product circuit 216 outputs information (sign information of G0×M2) indicating whether an outer product value of G0×M2 is positive to the determination circuit 219.

The outer product circuit 217 receives the error upper limit information G1 output from the node n1 and the determination upper limit information M1 output from the register 213 respectively as a first input vector and a second input vector and performs an outer product operation on the first input vector and the second input vector. The outer product circuit 217 outputs information (sign information of G1×M1) indicating whether an outer product value for G1×M1 is negative to the determination circuit 219.

The outer product circuit 218 receives the error lower limit information G2 output from the node n2 and the determination lower limit information M2 output from the register 214 respectively as a first input vector and a second input vector and performs an outer product operation on the first input vector and the second input vector. The outer product circuit 218 outputs information (sign information of G2×M2) indicating whether an outer product value for G2×M2 is positive to the determination circuit 219.

The determination circuit 219 performs Determination (1-2) based on the sign information of G0×M1 input from the outer product circuit 215. More specifically, in a case where the sign of G0×M1 is negative (G0×M1<0), the determination circuit 219 determines that the slope (evaluation value) of a segment joining the evaluation coordinates Pc and the reference coordinates Ps is below the upper limit value of the slope for the polygonal line determination (the result of Determination (1-2) is "Yes"). On the other hand, in a case where the sign of G0×M1 is equal to or greater than zero (G0×M1≥0), the determination circuit 219 determines that the evaluation value is above the upper limit value of the slope for the polygonal line determination (the result of Determination (1-2) is "No"). In addition, the determination circuit 219 performs Determination (1-3) based on the sign information of G0×M2 input from the outer product circuit 216. More specifically, in a case where the sign of G0×M2 is positive (G0×M2>0), the determination circuit 219 determines that the evaluation value is above the lower limit value of the slope for the polygonal line determination (the result of Determination (1-3) is "Yes"). On the other hand, in a case where the sign of G0×M2 is equal to or less than zero (G0×M2≤0), the determination circuit 219 determines that the evaluation value is below the lower limit value of the slope for the polygonal line determination (the result of Determination (1-3) is "No"). In other words, in a case where both the result of Determination (1-2) and the result of Determination (1-3) for the evaluation coordinates P(c) are "Yes", the determination circuit 219 determines that the evaluation coordinates P(c−1) of time (c−1) prior to the evaluation coordinates P(c) are not polygonal line vertex coordinate data. In addition, in a case where one of the result of Determination (1-2) or the result of Determination (1-3) for the evaluation coordinates P(c) is "No", the determination circuit 219 determines that the coordinates P(c−1) are polygonal line vertex coordinate data.

In addition, the determination circuit 219 performs Determination (1-5) based on the sign information of G1×M1 input from the outer product circuit 217. More specifically, in a case where the sign of G1×M1 is negative (G1×M1<0), the determination circuit 219 determines that the allowed error upper limit value of the evaluation value is below the upper limit value of the slope for the polygonal line determination (the result of Determination (1-5) is "Yes"). On the other hand, in a case where the sign of G1×M1 is equal to or greater than zero (G1×M1≥0), the determination circuit 219 determines that the allowed error upper limit value of the evaluation value is above the upper limit value of the slope for the polygonal line determination (the result of Determination (1-5) is "No"). In other words, the determination circuit 219 determines that the determination upper limit information M1 is to be updated with the error upper limit information G1 in a case where the result of Determination (1-5) is "Yes" and determines that the determination upper limit information M1 is to be maintained in the current state in a case where the result of Determination (1-5) is "No".

The determination circuit 219 performs Determination (1-6) based on the sign information of G2×M2 input from the outer product circuit 218. More specifically, in a case where the sign of G2×M2 is positive (G2×M2>0), the determination circuit 219 determines that the allowed error lower limit value of the evaluation value is above the lower limit value of the slope for the polygonal line determination (the result of Determination (1-6) is "Yes"). On the other hand, in a case where the sign of G2×M2 is equal to or less than zero (G2×M2≤0), the determination circuit 219 determines that the allowed error lower limit value of the evaluation value is below the lower limit value of the slope for the polygonal line determination (the result of Determination (1-6) is "No"). In other words, the determination circuit 219 determines that the determination lower limit information M2 is to be updated with the error lower limit information G2 in a case where the result of Determination (1-6) is "Yes" and determines that the determination lower limit information M2 is to be maintained in the current state in a case where the result of Determination (1-6) is "No".

In a case where one of the results of Determination (1-2) and Determination (1-3) acquired by the determination circuit 219 is determined to be "No", the output data FIFO module 220 receives the time data (c−1) from the ΔT counter 207 and receives the sensor data X(c−1) from the register 209. On the other hand, in a case where both the results of Determination (1-2) and Determination (1-3) acquired by the determination circuit 219 are determined to be "Yes", and there is no time series data to be output inside the input data FIFO module 201, the output data FIFO module 220 receives the time data c from the ΔT counter 207 and receives the sensor data X(c) from the register 209. The output data FIFO module 220 outputs a set of the time data and the sensor data that have been received to the data buffer 143 as polygonal line vertex coordinate data.

Figure 9:
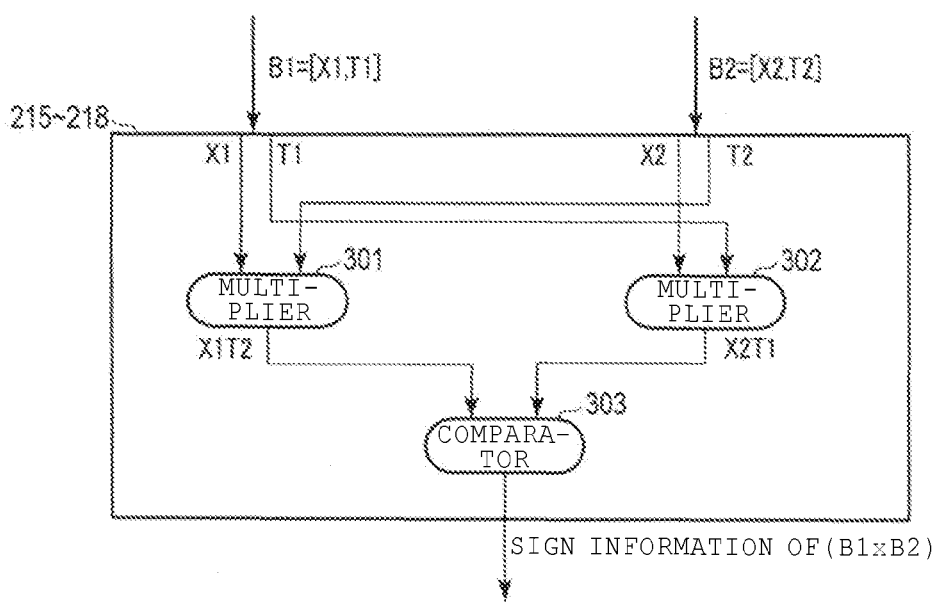
FIG. 9 is a circuit diagram that illustrates outer product circuits of the time series data compressing apparatus according to the first embodiment.

FIG. 9 is a circuit diagram that illustrates one example of the configuration of an outer product circuit (e.g., elements 215 to 218) of the time series data compressing apparatus according to the first embodiment. As illustrated in FIG. 9, outer product circuits 215 to 218 may have a same configuration and, for example, include multipliers 301 and 302 and a comparator 303. In the example illustrated in FIG. 9, a case will be described as one example in which vectors B1=[X1, T1] and B2=[X2, T2] of a homogeneous coordinate system are to be input respectively as a first input vector and a second input vector. The first input vector B1, for example, can be evaluation information G0, error upper limit information G1, or error lower limit information G2. The second input vector B2, for example, can be determination upper limit information M1 or determination lower limit information M2.

A first component X1 of the first input vector B1 and a second component T2 of the second input vector B2 are input to the multiplier 301 respectively as a first input value and a second input value. The multiplier 301 outputs a multiplication result X1T2 of the first input value X1 and the second input value T2 to the comparator 303.

A first component X2 of the second input vector B2 and a second component T1 of the first input vector B1 are input to the multiplier 302 respectively as a first input value and a second input value. The multiplier 302 outputs a multiplication result X2T1 of the first input value X2 and the second input value T1 to the comparator 303.

The comparator 303 compares the value X1T2 output from the multiplier 301 and the value X2T1 output from the multiplier 302 and then outputs a result (the sign of B1×B2) of the comparison. As the result of the comparison, in a case where the value X1T2 is less than the value X2T1, the comparator 303 determines that the sign of B1×B2 is negative (B1×B2<0) and, for example, outputs a signal of a high (H) level to the determination circuit 219 as the sign information of B1×B2. On the other hand, as the result of the comparison, in a case where the value X1T2 is equal to or greater than the value X2T1, the comparator 303 determines that the sign of B1×B2 is zero or positive (B1×B2≥0) and, for example, outputs a signal of a low (L) level to the determination circuit 219 as the sign information of B1×B2.

1.1.4 Details of Functional Configuration of Coding Unit

Next, the functional configuration of the coding unit of the time series data compressing apparatus 10 according to the first embodiment will be described in detail.

The coding unit 145, for example, includes the following three functions for coding the coding target data and generating compressed data.

Function (2-1): a function for determining a parameter Kt used for coding time prediction error data dT into a shortest code length by comparing code lengths of bit strings generated when a plurality of coding tables having mutually-different values of the parameter K are applied to the time prediction error data dT.

Function (2-2): a function for determining a parameter Kx used for coding sensor prediction error data dX into a shortest code length by comparing code lengths of bit strings generated when a plurality of coding tables having mutually-different values of the parameter K are applied to the sensor prediction error data dX.

Function (2-3): a function for applying a coding table of the parameter Kt determined by Function (2-1) and a coding table of the parameter Kx determined in Function (2-2) to coding target data and outputting resultant data as compressed data.

By performing such functions (2-1) to (2-3), the coding unit 145 thus selects a coding table for the parameters Kt and Kx (respectively) for which the data size of the compressed data is smallest regardless of the characteristics of the coding target data. Then, the coding unit 145 adaptively changes the selection of the parameters Kt and Kx that are optimal as described above for each block and performs a coding process.

Figure 10:
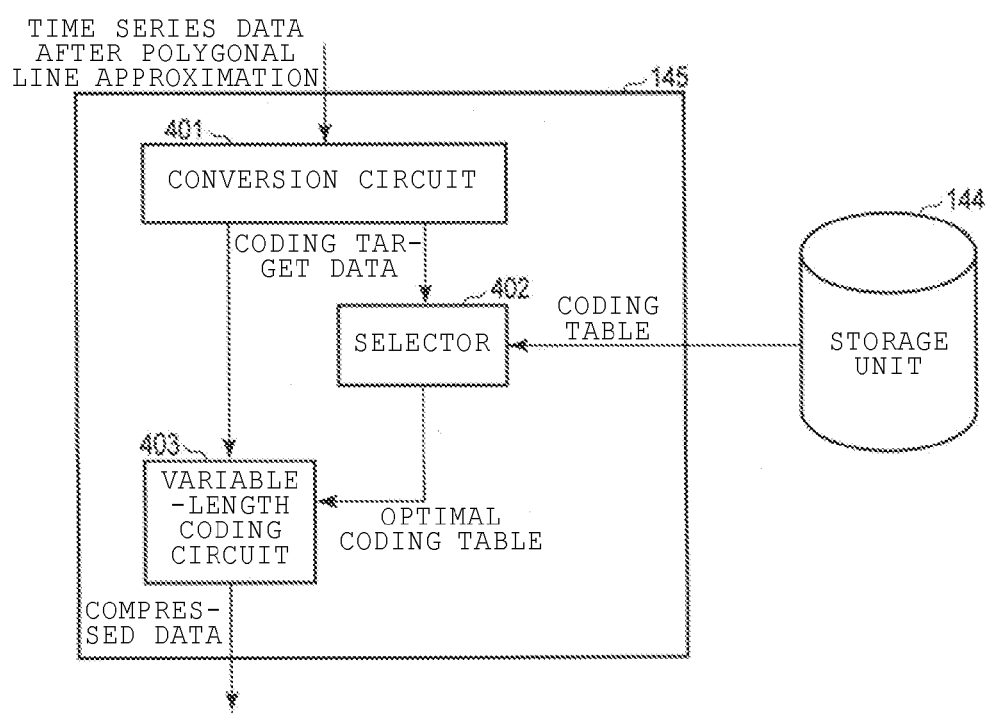
FIG. 10 is a block diagram that illustrates the configuration of a coding unit of the time series data compressing apparatus according to the first embodiment.

FIG. 10 is a block diagram that illustrates one example of the coding unit of the time series data compressing apparatus according to the first embodiment. As illustrated in FIG. 10, the coding unit 145 includes a conversion circuit 401, a selector 402, and a variable-length coding circuit 403.

The conversion circuit 401 reads time series data after the polygonal line approximation that corresponds to one block from the data buffer 143 and converts the time series data after the polygonal line approximation into coding target data. The conversion circuit 401 transmits the coding target data to the selector 402 and the variable-length coding circuit 403.

When the coding target data is received from the conversion circuit 401, the selector 402 reads a plurality of coding tables having mutually-different values of the parameter K, for example, from the storage unit 144. The selector 402 calculates a code length of compressed data generated based on each of the plurality of read coding tables. In other words, the selector 402 calculates code lengths for all the values of the parameter K based on information relating to a code length stored inside the coding table without generating compressed data. The selector 402 compares the calculated code lengths with each other and transmits a coding table corresponding to an optimal parameter for which a shortest code length is calculated as a result of the comparison to the variable-length coding circuit 403 as an optimal coding table.

More specifically, for example, the selector 402 sequentially reads a plurality of coding tables having mutually-different values of the parameter K from the storage unit 144. By referring to the information of code lengths stored inside the read coding table, the selector 402 calculates a code length for compressed data that would be acquired if a variable-length coding process was performed on the data, however it does this without actually performing the variable-length coding process, but rather merely lookups of code length values stored in the coding tables. The selector 402 performs this calculation of a code length for all the values of the parameter K maintained in the storage unit 144 and extracts the coding table for which the code length will be shortest. In addition, the code length calculating process and the process of extracting an optimal coding table can be independently performed for the time prediction error data dT and the sensor prediction error data dX of the coding target data. In other words, the selector 402, for example, has a configuration including Function (2-1) and Function (2-2) described above.

The variable-length coding circuit 403 receives the coding target data from the conversion circuit 401 and receives the optimal coding table from the selector 402. The variable-length coding circuit 403 performs variable-length coding on the coding target data based on the optimal coding table, thereby generating compressed data. The variable-length coding circuit 403 transmits this generated compressed data to the communication unit 141.

In addition, the variable-length coding circuit 403 independently performs the variable-length coding process for the time prediction error data dT and the sensor prediction error data dX of the coding target data. In other words, the variable-length coding circuit 403, for example, has a configuration having Function (2-3) described above.

1.2 Operation

Next, the operation of the time series data compressing apparatus according to the first embodiment will be described.

1.2.1 Operation of Overall Time Series Data Compressing System

Figure 11:
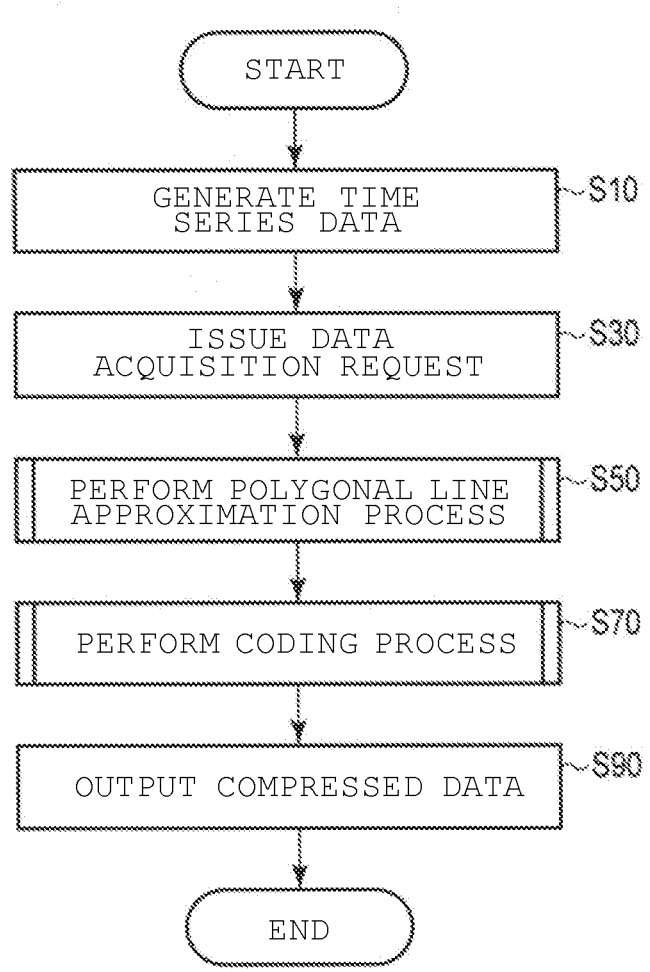
FIG. 11 is a flowchart that illustrates one example of overall operation of the time series data compressing apparatus according to the first embodiment.

First, the operation of the overall time series data compressing system will be described with reference to FIG. 11. FIG. 11 is a flowchart that illustrates the operation of the time series data compressing system 1 according to the first embodiment.

As illustrated in FIG. 11, in Step S10, the sensor 30 acquires time series data. The sensor 30 transmits the acquired time series data to the sensor interface circuit 17. The CPU 12 writes the time series data transmitted to the sensor interface circuit 17 into the system memory 13 via the system bus 11.

In Step S30, the mobile terminal 2 issues a data acquisition request to the IoT apparatus 3. The external input/output interface circuit 15 of the time series data compressing apparatus 10 receives the data acquisition request. The external input/output interface circuit 15 transmits the data acquisition request to the CPU 12 through the system bus 11.

When the data acquisition request is received, the CPU 12 issues a command for the generation of compressed data to the data compressing circuit 14. When the command is received, the communication unit 141 of the data compressing circuit 14 reads stored time series data from the system memory 13 and transmits this just read time series data to the polygonal line approximating unit 142.

In Step S50, when the time series data is received, the polygonal line approximating unit 142 performs the polygonal line approximating process on the time series data. The polygonal line approximating unit 142 extracts polygonal line vertex coordinate data included in the time series data as a result of the polygonal line approximating process and transmits the extracted polygonal line vertex coordinate data to the data buffer 143. The data buffer 143 stores the polygonal line vertex coordinate data included in the time series data as time series data of one block after the polygonal line approximation.

In Step S70, the coding unit 145 reads the time series data of one block that has been stored inside the data buffer 143 and performs a variable-length coding process. The coding unit 145 generates compressed data as a result of the variable-length coding process and transmits the generated compressed data to the communication unit 141. When the compressed data is received, the communication unit 141 transmits the compressed data to the system memory 13 and issues a response indicating the compressed data has been generated to the CPU 12.

In Step S90, when the response indicating compressed data has been generated is received by CPU 12, the CPU 12 reads (or causes the reading of) the compressed data from the system memory 13 and transmits (or causes the transmission of) this just read compressed data to the mobile terminal 2 through the external input/output interface circuit 15 in response to the data acquisition request.

In this way, the whole operation of the time series data compressing system 1 is completed.

1.2.2 Operation at Time of Performing Polygonal Line Approximating Process

Figure 12:
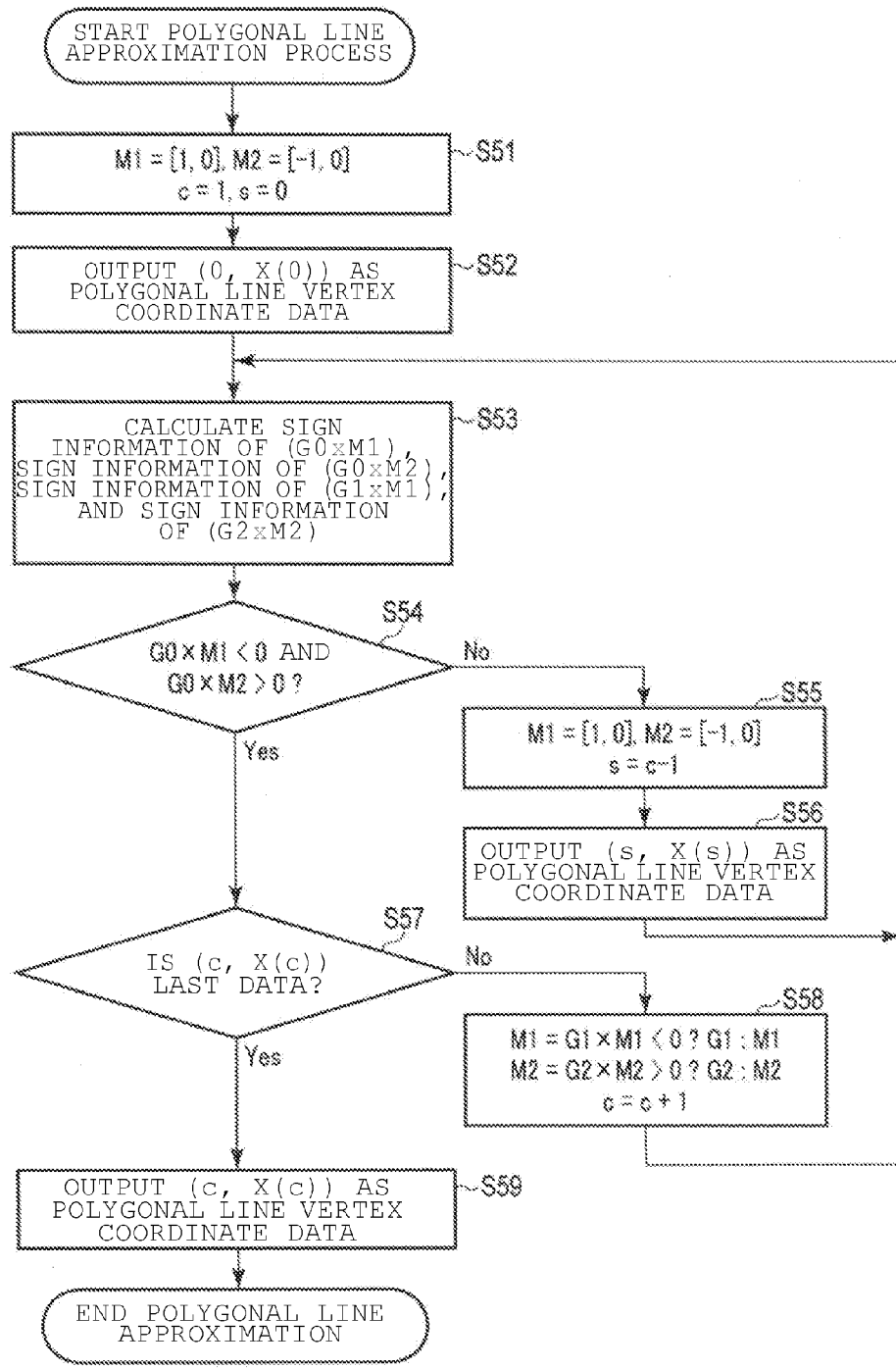
FIG. 12 is a flowchart that illustrates one example of an operation of the time series data compressing apparatus according to the first embodiment that is performed when a polygonal line approximating process is performed.

Next, an operation at the time of performing the polygonal line approximating process according to the first embodiment will be described with reference to FIG. 12. FIG. 12 is a flowchart that illustrates an operation of the time series data compressing apparatus according to the first embodiment that is performed at the time of performing the polygonal line approximating process. In description presented below, it is assumed that the time series data has been input from the communication unit 141 to the input data FIFO module 201, and the register 203 stores in advance the allowed error value e as a fixed value.

As illustrated in FIG. 12, in Step S51, the polygonal line approximating unit 142 initializes values stored in the $\Delta T$ counter 207 and the registers 213 and 214. More specifically, initial values of the time data c, the time data (c−1), and the value (c−s) are set in the $\Delta T$ counter 207, an initial value of the determination upper limit information M1 is set in the register 213, and an initial value of the determination lower limit information M2 is set in the register 214 as illustrated below.

$$c=1, c-1=1-1=0, c-s=1-0=1$$

$$M1=[Xm1,Tm1]=[1,0]$$

$$M2=[Xm2,Tm2]=[-1,0]$$

Step S51 corresponds to the operation for performing Function (1-1).

In Step S52, the polygonal line approximating unit 142 outputs the first coordinates (0, X(0)) of the time series data as a polygonal line approximation coordinate data. More specifically, the input data FIFO module 201 outputs the first sensor data X(0) (T=0) to the register 208. The register 208 outputs the received sensor data X(0) to the register 209. The register 209 maintains this received sensor data X(0) and outputs this received sensor data to the register 202 and the output data FIFO module 220. The register 202 maintains the received sensor data X(0) as the sensor data X(s) (s=0) for the reference coordinates Ps. The $\Delta T$ counter 207 outputs the time data (c−1=0) to the output data FIFO module 220. The output data FIFO module 220 outputs a coordinate set (0, X(0)) to the data buffer 143 as polygonal line vertex coordinate data—that is, the first coordinate in the polygonal line vertex coordinate data is thus (0, X(0)).

Step S52 corresponds to an operation for performing Function (1-4).

Subsequently, the polygonal line approximating unit 142 prepares for entering a loop process for determining whether each subsequent coordinate data in the input data time series is to be output as part of the polygonal line vertex coordinate data. More specifically, the input data FIFO module 201 outputs next sensor data X(1) (T=1) to the register 208 and the adder/subtractor units 204 to 206. The register 208 maintains the received sensor data X(1). In addition, the register 202 outputs the stored sensor data X(0) to the adder/subtractor units 204 to 206. The register 203 outputs the stored allowed error value e to the adder/subtractor units 205 and 206.

The adder/subtractor unit 204 performs adder/subtractor operations based on the sensor data X(1) and sensor data X(0) that have been received and outputs a value (X(1)−X(0)) to the register 210. The register 210 stores the received value (X(1)−X(0)).

The adder/subtractor unit 205 performs adder/subtractor operations based on the sensor data X(1) and the sensor data X(0) that have been received and the allowed error value e and outputs a value (X(1)−X(0)+e) to the register 211. The register 211 maintains the received value (X(1)−X(0)+e).

The adder/subtractor unit 206 performs adder/subtractor operations based on the sensor data X(1) and the sensor data X(0) that have been received and the allowed error value e and outputs a value (X(1)−X(0)−e) to the register 212. The register 212 stores the received value (X(1)−X(0)−e).

In this way as described above, the preparation for entering a loop process is completed, and, in a subsequent process, the loop processing through each of the remaining input time date series values is performed. In description presented below, the input data FIFO module 201 is assumed to output the sensor data X(c) of the evaluation coordinates Pc. The register 202 is assumed to maintain the sensor data X(s) of the reference coordinates Ps. The ΔT counter 207 is assumed to maintain the time data c and (c−1) and the value (c−s). The register 208 is assumed to maintain the sensor data X(c), and the register 209 is assumed to maintain the sensor data X(c−1). The registers 210 to 212 are assumed to respectively maintain values (X(c)−X(s)), (X(c)−X(s)+e), and (X(c)−X(s)−e). Here, s is the time index value of the last extracted vertex coordinate in the input time series data or the initial value (0)), and c is the time index value being tested/evaluated to determine if it is the next vertex coordinate to be extracted from the input time series data. The register 213 is assumed to maintain the determination upper limit information M1=[Xm1, Tm1], and the register 214 is assumed to maintain the determination lower limit information M2=[Xm2, Tm2].

In Step S53, the polygonal line approximating unit 142 simultaneously performs four outer product operations in parallel with each other.

More specifically, the ΔT counter 207 respectively outputs the maintained value (c−s) to the nodes n0 to n2. The register 210 outputs the maintained value (X(c)−X(s)) to the node n0. The register 211 outputs the maintained value (X(c)−X(s)+e) to the node n1. The register 212 outputs the maintained value (X(c)−X(s)−e) to the node n2. The node n0 integrates the value (c−s) and the value (X(c)−X(s)) that have been received and outputs the integrated value to the outer product circuits 215 and 216 as evaluation information G0=[X(c)−X(s), c−s]. The node n1 integrates the value (c−s) and the value (X(c)−X(s)+e) that have been received and outputs a result thereof to the outer product circuit 217 as error upper limit information G1=[X(c)−X(s)+e, c−s]. The node n2 integrates the value (c−s) and the value (X(c)−X(s)−e) that have been received and outputs a result thereof to the outer product circuit 218 as error lower limit information G2=[X(c)−X(s)−e, c−s]. The register 213 outputs the currently maintained value of the determination upper limit information M1 to the outer product circuits 215 and 217. The register 214 outputs the currently maintained value of the determination lower limit information M2 to the outer product circuits 216 and 218.

The outer product circuit 215 performs an outer product operation G0×M1 based on the evaluation information G0 and the determination upper limit information M1 that have been received and outputs the sign information of G0×M1 to the determination circuit 219. The outer product circuit 216 performs an outer product operation G0×M2 based on the evaluation information G0 and the determination lower limit information M2 that have been received and outputs the sign information of G0×M2 to the determination circuit 219. The outer product circuit 217 performs an outer product operation G1×M1 based on the error upper limit information G1 and the determination upper limit information M1 that have been received and outputs the sign information of G1×M1 to the determination circuit 219. The outer product circuit 218 performs an outer product operation G2×M2 based on the error lower limit information G2 and the determination lower limit information M2 that have been received and outputs the sign information of G2×M2 to the determination circuit 219. In other words, the four outer product operations (performed by eight multiplication operations) performed by the outer product circuits 215 to 218 can be simultaneously performed.

In Step S54, the polygonal line approximating unit 142 performs Determination (1-2) and Determination (1-3). More specifically, the determination circuit 219 determines whether G0×M1 is negative (G0×M1<0) based on the received sign information of G0×M1. In addition, the determination circuit 219 determines whether G0×M2 is positive (G0×M2>0) based on the received sign information of G0×M2. In a case where it is determined that G0×M1<0 and G0×M2>0 as the results of Determination (1-2) and Determination (1-3) (Step S54: Yes), the determination circuit 219 determines that a polygonal line approximation vertex is not present between the stored reference coordinates Ps and the current evaluation coordinates Pc, and the process proceeds to Step S57. On the other hand, in a case where it is determined that G0×M2≥0 or G0×M2≤0 (Step S54: No), the determination circuit 219 determines that a polygonal line approximation vertex is present between the reference coordinates Ps and the evaluation coordinates Pc, and the process proceeds to Step S55.

Step S53 and Step S54 respectively correspond to operations for performing Function (1-2) and Function (1-3).

In Step S55, the polygonal line approximating unit 142 performs initialization operations for setting the coordinates P(c−1) to the new reference coordinates Ps for the next Determination (1-2) and Determination (1-3) processing (S54). More specifically, for example, the value (c−s) in the ΔT counter 207 is updated, the determination upper limit information M1 in the register 213 is updated, and the determination lower limit information M2 in the register 214 is updated as below:

$$c-s=c-(c-1)=1$$

$$M1=[Xm1,Tm1]=[1,0]$$

$$M2=[Xm2,Tm2]=[-1,0]$$

Step S55 corresponds to an operation for performing Function (1-1) in a manner similar to step 51.

In Step S56, the polygonal line approximating unit 142 outputs the coordinates P(c−1) as a polygonal line vertex coordinate data. More specifically, for example, the ΔT counter 207 outputs the maintained time data (c−1) to the output data FIFO module 220. In addition, the register 209 outputs the maintained sensor data X(c−1) to the output data FIFO module 220. The output data FIFO module 220 thus outputs a coordinate set (c−1, X(c−1)) to the data buffer 143 as part of the polygonal line vertex coordinate data.

Thereafter, the polygonal line approximating unit 142 returns to Step S53.

Step S56 corresponds to an operation for performing Function (1-4).

In Step S57, the polygonal line approximating unit 142 determines whether the sensor data X(c) is the last data in the input time series data. More specifically, in a case where there is no time series data left to be output from the input data FIFO module 201, the polygonal line approximating unit 142 determines that the sensor data X(c) currently maintained in the register 208 is the last data to be evaluated in the input time series data (Step S57: Yes), and the process proceeds to Step S59. On the other hand, in a case where there is data still to be output from the input data FIFO module 201, the determination circuit 219 determines that the sensor data X(c) maintained in the register 208 not the last data in the input time series data (Step S57: No), and the process proceeds to Step S58.

In Step S58, the polygonal line approximating unit 142 performs Determination (1-5) and Determination (1-6).

More specifically, the determination circuit 219 determines whether G1×M1 is negative (G1×M1<0) based on the received sign information of G1×M1. In addition, the determination circuit 219 determines whether G2×M2 is positive (G2×M2 >0) based on the received sign information of G2×M2.

In a case where it is determined that G1×M1<0 (as a result of Determination (1-5)), the determination circuit 219 updates the upper limit information M1 maintained in the register 213 with the error upper limit information G1. On the other hand, in a case where it is determined that G1×M1≥0, the determination circuit 219 continues to maintain the currently stored upper limit information M1 in the register 213.

In addition, in a case where it is determined that G2×M2>0 (as a result of Determination (1-6)), the determination circuit 219 updates the lower limit information M2 maintained in the register 214 with the error lower limit information G2. On the other hand, in a case where it is determined that G2×M2≤0, the determination circuit 219 continues to maintain the currently stored lower limit information M2 in the register 214.

The ΔT counter 207 counts up (increments) the values of the time data c and (c−1) and the value (c−s) at this step (S58).

Thereafter, the polygonal line approximating unit 142 returns to Step S53.

Step S58 corresponds to an operation for performing Function (1-5), Function (1-6), and Function (1-7).

In Step S59, the polygonal line approximating unit 142 outputs the coordinate data (c, X(c)) to the data buffer 143 as polygonal line vertex coordinate data when it is determined that coordinate data (c, X(c)) is the last data in the time series data to be evaluated. More specifically, for example, the ΔT counter 207 outputs the maintained time data c to the output data FIFO module 220. In addition, the register 208 outputs the maintained sensor data X(c) to the register 209. The register 209 outputs the received sensor data X(c) to the output data FIFO module 220. The output data FIFO module 220 outputs a set (c, X(c)) o to the data buffer 143 as part of the polygonal line vertex coordinate data.

Step S59 corresponds to an operation for performing Function (1-4).

As above, the polygonal line approximating operation ends.

In addition, as described above, in a case where the process is determined to proceed to Step S58 from Step S57, sensor data (X(T)) output from the input data FIFO module 201 is also updated in Step S58. In other words, every time when a series of the loop process of Steps S53 to S58 are performed, a sensor value output from the input data FIFO module 201 is updated.

In addition, in a case where the process is determined to proceed to Step S55 from Step S54, initialization values are used to set to the determination upper limit information M1 and the determination lower limit information M2. For this reason, when a series of the loop process of Steps S53 to S56 are performed, in the next Step S54, the determination can be made to necessarily proceed to Step S57.

In other words, in the series of the loop process of Steps S53 to S58, in a case where the process arrives at Step S58 without performing Steps S55 and S56, the input data FIFO module 201 updates the sensor data to be output after the parallel multiplication process of Step S53 has been performed once. On the other hand, in a case where Steps S55 and S56 are performed, the input data FIFO module 201 updates the sensor data to be output after the multiplication process of Step S53 is performed twice.

The multiplication process of Step S53 generally requires a time longer than those of the other processes in the looping. For this reason, in a case where Steps S55 and S56 are not performed, the input data FIFO module 201 can update the sensor data to be output within one clock period (hereinafter, simply referred to as "one clock" or "one clock cycle") in which a clock disposed inside the data compressing circuit 14 performs a one-clock operation. On the other hand, in a case where Steps S55 and S56 are performed, a pipeline stall can occur in Stage B, and there is a possibility that the input data FIFO module 201 cannot update the sensor data within one clock cycle. In other words, unless coordinate data included in the time series data is determined to be polygonal line vertex coordinate data, the polygonal line approximating unit 142 can proceed to the process of determining the next coordinate data within one clock cycle.

1.2.3 Operation Performed at Time of Coding Process

Figure 13:
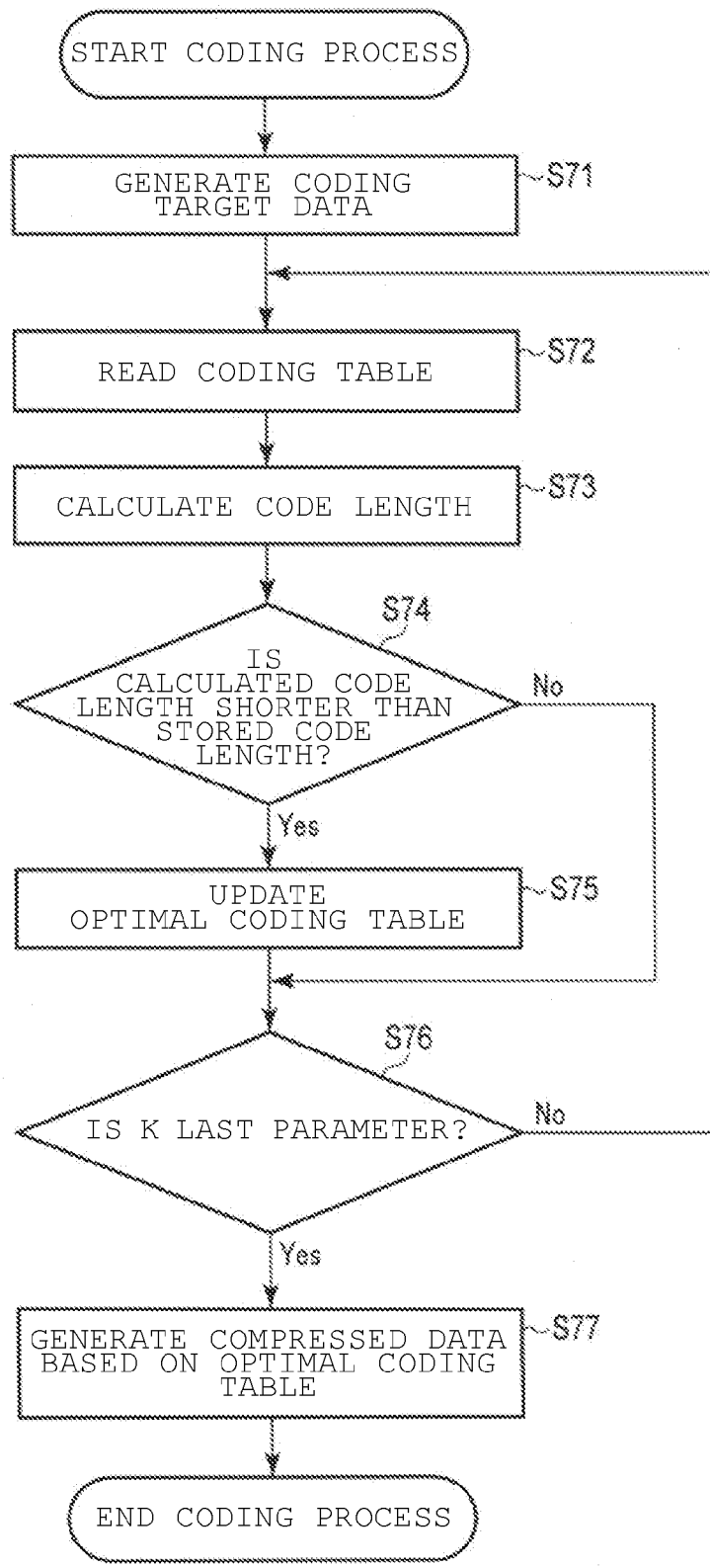
FIG. 13 is a flowchart that illustrates one example of an operation of the time series data compressing apparatus according to the first embodiment that is performed at the time of performing a variable-length coding process.

Next, an operation performed at the time of the coding process according to the first embodiment will be described with reference to FIG. 13. FIG. 13 is a flowchart that illustrates the operation of the time series data compressing apparatus according to the first embodiment performed at the time of performing a coding process. The variable-length coding circuit 403, for example, performs a variable-length coding process by applying coding tables in the ascending order from the parameter K=0, and, in description presented below, an operation of a case where variable-length coding is performed using a coding table of a certain parameter K=Kn will be described.

As illustrated in FIG. 13, the conversion circuit 401 reads time series data from the data buffer 143 after the polygonal line approximation and subsequently generates coding target data based on this just read time series data in Step S71. The conversion circuit 401 transmits the generated coding target data to the selector 402.

In Step S72, the selector 402 reads a coding table of parameter K=Kn from among a plurality of coding tables from the storage unit 144 for each time prediction error data dT and each sensor prediction error data dX.

In Step S73, the selector 402, calculates a code length of compressed data generated by using the information regarding code lengths from the coding tables that could be applied the coding target data to generate the compressed data. More specifically, the selector 402 calculates a code length of a bit string corresponding to the time data and a code length of a bit string corresponding to the sensor data.

In Step S74, the selector 402 determines whether the calculated code length is shorter than the code length calculated until now for the same coding target data. More specifically, in a case where the parameter K=Kn is the first parameter (K=0), the selector 402 temporarily stores the calculated code length. On the other hand, in a case where the parameter K=Kn is not the first parameter, but a code length is temporarily stored until then, the selector 402 compares the stored code length with the calculated code length and determines a shorter code length. As a result of the determination, in a case where the calculated code length is determined to be shorter than the stored code length (Step S74: Yes), the selector 402 regards the calculated code length to be the shortest of code lengths calculated until now, and the process proceeds to Step S75. On the other hand, in a case where the calculated code length is determined not to be shorter than the stored code length (Step S74: No), the selector 402 regards the code length that is temporarily stored to be the shortest of code lengths calculated until now and continues to maintain the code length that is temporarily stored, and the process proceeds to Step S76.

In Step S75, the selector 402 updates the temporarily-stored code length with the calculated code length, thereby updating the optimal coding table. Thereafter, the selector 402 performs Step S76.

In Step S76, the selector 402 determines whether the parameter K=Kn of the coding table read in Step S72 is the last parameter. In a case where the parameter K=Kn is not the last parameter (S76: No), the process proceeds to Step S72, and subsequent Steps S72 to S76 for the next parameter K=K(n+1) is recursively performed. On the other hand, in a case where the parameter K=Kn is the last parameter (S76: Yes), the selector 402 determines that the temporarily-stored code length is the shortest code length. The selector 402 transmits a coding table corresponding to the shortest code length from the storage unit 144 to the variable-length coding circuit 403 as an optimal coding table. Thereafter, the process proceeds to Step S77.

In Step S77, the variable-length coding circuit 403 performs a variable-length coding process based on the optimal coding table, thereby generating compressed data. More specifically, the conversion circuit 401 reads time series data after the polygonal line approximation from the data buffer 143 again, thereby generating coding target data. The conversion circuit 401 transmits the generated coding target data to the variable-length coding circuit 403. The variable-length coding circuit 403 performs a variable-length coding process by applying the optimal coding table to the received coding target data, thereby generating compressed data. The variable-length coding circuit 403 transmits the generated compressed data to the communication unit 141.

Here, in the recursive process relating to Steps S72 to S76, a portion relating to the time data and a portion relating to the sensor data are independently performed. For this reason, in Step S77, the variable-length coding circuit 403 receives a coding table of the parameters Kt and Kx coding the time data and the sensor data into shortest code lengths as an optimal coding table. In other words, the variable-length coding circuit 403 can generate compressed data by performing an optimal variable-length coding process for each of the time data and the sensor data.

In the way described above, the operation of the coding process ends.

Steps S72 to S76 correspond to operations for performing Function (2-1) and Function (2-2).

Step S77 corresponds to an operation for performing Function (2-3).

1.3 Effect Relating to this Embodiment

According to the first embodiment, time series data can be compressed at a high throughput. This effect will be further described below.

The IoT apparatus 3 acquires time series data from a built-in sensor 30. The bit depth of the time series data to be acquired by the sensor 30 is about 16 to 24 bits and, compared to a bit depth (about 8 to 10 bits) of image data or the like, is very deep. The acquired time series data of large capacity could be transmitted to an external device such as a mobile terminal 2 or the like for use. However, the IoT apparatus 3 is generally required to have low power consumption and use only a narrow band for communication with the external device. For this reason, transmission of time series data having a large size is not preferred, and it is desirable to compress the time series data in some manner to reduce the communication resources required to transfer the time series data to the mobile terminal 2 or the like.

As conventional data compression technologies, orthogonal transformation, pattern matching, and polygonal line approximation are known. Among these, polygonal line approximation is a technology that is relatively simple and has high versatility, compared to the orthogonal transformation and the pattern matching techniques, and thus has an advantage in that a data processing amount and an occupied work memory are small when this compression technique is applied.

However, the conventional data compression technology using a polygonal line approximation includes a division process for which the calculation time(s) are relatively long. The relatively long calculation time for this division processes is problematic inside a process that is sequential. Data throughput is not high with the conventional technique, and, as a result, the power-on time increases, which is an obstacle for power saving. In other words, in the conventional technology, there is a need to improve (increase) the throughput for compressing time series data.

According to the configuration of the first embodiment, the polygonal line approximating unit 142 of the time series data compressing apparatus 10 has a function for processing the evaluation information G0, the error upper limit information G1, the error lower limit information G2, the determination upper limit information M1, and the determination lower limit information M2 in a homogeneous coordinate system. In addition, accompanied with this, the polygonal line approximating unit 142 includes the outer product circuits 215 to 218. Each of the outer product circuits 215 to 218 outputs the sign information of G0×M1, the sign information of G0×M2, the sign information of G1×M1, and the sign information of G2×M2. Such outer product circuits 215 to 218 are connected in parallel for simultaneously performing calculation in a polygonal line approximating process. Accordingly, the time series data can be compressed at a high throughput.

Furthermore, in a conventional polygonal line determining process, division operations of at least three times is used in the middle of one loop process for determining whether any particular coordinate data is polygonal line vertex coordinate data. In addition, this division process, which is performed three times, has a long processing time and cannot be performed in parallel. According to the configuration of the first embodiment, by including the outer product circuits 215 to 218, a multiplication operation is performed eight times instead of the division operation being performed three times, but a result equal to that of the conventional technology can still be achieved. In addition, as described above, the outer product circuits 215 to 218 are connected in parallel, and data input to each of the outer product circuits has no mutual-dependency. For this reason, the multiplication of eight times (performed by the outer product circuits 215 to 218) can be performed in the same time as required for one multiplication operation because the multiplication operations are simultaneously performed (in parallel) in the process. Accordingly, when it is necessary to determine whether particular coordinate data included in the input time series data is polygonal line vertex coordinate data, the determination can be made within one clock cycle. Accordingly, a processing time required for the one loop process can be markedly decreased as compared to the conventional process, and time series data can thus be compressed at a high throughput. In addition, in conjunction with high throughput compression, the period in which the power of the time series data compressing apparatus 10 is required to be turned on can be decreased as compared to the convention technique performed on time series data of the same size, and accordingly, power saving can be achieved.

In addition, according to a first aspect of the first embodiment, one of data input to the multipliers 301 and 302 arranged inside the outer product circuits 215 to 218 is the time data T included in the time series data. Accordingly, the circuit size of the multipliers 301 and 302 can be small.

Furthermore, the time data T has an integer value and thus has a small data size. In addition, since the compression rate of time series data that is expected according to the polygonal line approximating process is about 10 times, the polygonal line vertex coordinate data is extracted at the ratio of one to ten coordinates of data on the average. In other words, the dynamic range of the time data T is an integer value of about 10. In other words, the time data T input to the multipliers 301 and 302 has at most about five bits. Meanwhile, the required circuit size of the multipliers 301 and 302 is strongly influenced by a shorter bit-length side of two inputs. For this reason, the circuit size of the multipliers 301 and 302 is influenced by the bit length of the time data T, and the multipliers can be provided at a small circuit scale. Accordingly, even in a case where three dividers are replaced by eight multipliers, the circuit scale can still be decreased.

According to a second aspect of the first embodiment, the time series data compressing apparatus 10 includes the coding unit 145. The coding unit 145 generates coding target data based on the time series data after the polygonal line approximation. The coding unit 145 performs a variable-length coding process using a coding table stored in advance on generated coding target data, thereby generating compressed data. Accordingly, the time series data can be further compressed at a high throughput.

Furthermore, in a case where compressed data is transmitted from the IoT apparatus 3 to the mobile terminal 2, there are many cases where the communication band width is extremely limited. For this reason, it is preferable that, in addition to the polygonal line approximating process, the data size of the time series data is further compressed such that communication can be performed within a narrow band. The time series data provided by the polygonal line approximating process is aligned in a time series. For this reason, a correlation can be assumed between adjacent coordinate data in the time series data provided by the polygonal line approximation processing. By generating the time series data after the polygonal line approximation using a correlation, the time series data after the polygonal line approximation can be converted to coding target data having a high occurrence frequency of a value near zero over one block. Accordingly, coding target data that is suitable for variable-length coding can be generated. Thus, by applying a variable-length coding system to the coding target data, the coding unit 145 can generate compressed data at a high compression rate.

According to a third aspect of the first embodiment, in the storage unit 144, a plurality of coding tables is stored in advance. The coding unit 145 calculates a code length for each of the available coding target tables by notionally applying each of the plurality of coding tables to same coding target data. Then, the coding unit 145 selects a shortest code length from among the plurality of calculated code lengths and generates compressed data using a coding table that provides the shortest code length for each parameter. In this way, for each block of time series data, a coding table of a parameter K having a highest compression rate (shortest code length) can be selected.

Furthermore, for example, the following three operations can be applied in setting a parameter K for acquiring a high compression rate.

(a) A compression rate evaluation can be performed for typical sensor data in advance, and the parameter K can be determined according to this advance evaluation. The parameter K used at the time of performing a subsequent coding process is then accordingly fixed.

(b) Within one block of time series data after the polygonal line approximation, the parameter K can be dynamically changed. For example, based on characteristics of data that has been input up until the present data, an appropriate value of the parameter K can be predicted.

(c) For same time series data, a coding process can be performed using each of a plurality of parameters K prepared in advance, and a parameter K having the highest compression rate can be selected.

The operation (a) has a high possibility of acquiring an appropriate result in a case where a coding process is performed on time series data. However, in the first embodiment, the time series data needs to be compressed at a high throughput, and accordingly, the time series data can be thinned out in advance by the polygonal line approximating process. Accordingly, there are cases where the time series data after the polygonal line approximation will be influenced by a parameter (for example, the allowed error value e) of the polygonal line approximating process and has characteristics that are different from the original characteristics of the time series data. Thus, according to the operation (a), it may be difficult to set a parameter K for which a high compression rate is acquired.

According to the operation (b), in a case where a parameter K used for coding certain coordinate data included inside coding target data is determined, when a prediction function capable of predicting the certain coordinate data with high accuracy based on coordinate data prior to the certain coordinate data can be prepared, a high compression rate can be expected. However, in the first embodiment, time series data needs to be compressed at a high throughput, and accordingly, the time series data is thinned out in advance by the polygonal line approximating process. Accordingly, in coordinate data included in the coding data, a time interval between adjacent data is increased by the polygonal line approximating process, and a change in the distribution tendency tends to be sharp. For this reason, it is difficult to predict next coordinate data with high accuracy based on prior coordinate data, and there is a high possibility that the compression rate will be lowered. Thus, according to the operation (b), it may be difficult to set a parameter K for which a high compression rate is acquired.

According to the operation (c), while the parameter K cannot be changed for each coordinate data, the parameter K can be changed for each block. In addition, since all the coding tables can be applied to actual coding target data, the parameter K having a high compression rate can be selected. Furthermore, a ratio of a time required for the coding process to the whole process is very low. For this reason, time series data can be compressed at a high throughput. Accordingly, it can be considered to be appropriate to select the parameter K by using the operation (c). In other words, according to the second aspect of the first embodiment, a high compression rate can be secured while time series data is compressed at a high throughput.

2. Second Embodiment

Next, a time series data compressing apparatus according to a second embodiment will be described. In the time series data compressing apparatus according to the second embodiment, duplicate multiplication operations in the polygonal line approximating process performed by the time series data compressing apparatus according to the first embodiment are omitted, and the required number of multiplication operations is decreased. In description presented below, description of a configuration aspects substantially similar to those of the first embodiment will not be presented, and only parts different from the first embodiment will be particularly described.

2.1 Function of Polygonal Line Approximating Unit

The function of a polygonal line approximating unit of the time series data compressing apparatus according to the second embodiment will be described in detail.

The polygonal line approximating unit 142 (see FIG. 14) defines values g0m1, g0m2, g1m1, and g2m2. The value g0m1 represents an outer product value of G0×M1, and the value g0m2 represents an outer product value of G0×M2. In addition, the value g1m1 represents a sum of the value g0m1 and a value eTm1, and the value g2m2 represents a difference between the value g0m2 and a value eTm2. The value eTm1 represents a product of an allowed error value e and a second component Tm1 of determination upper limit information M1=[Xm1, Tm1], and the value eTm2 represents a product of the allowed error value e and a second component Tm2 of determination lower limit information M2=[Xm2, Tm2].

Accordingly, Function (1-2), Function (1-3), Function (1-5), and Function (1-6) included in the polygonal line approximating unit 142 are respectively achieved by configurations capable of performing the following Determination (1-2a), Determination (1-3a), Determination (1-5a), and Determination (1-6a).

Determination (1-2a):

$$g0m1=G0\times M1=(X(c)-X(s))\cdot Tm1-(c-s)\cdot Xm1<0$$

Determination (1-3a):

$$g0m2=G0\times M2=(X(c)-X(s))\cdot Tm2-(c-s)\cdot Xm2>0$$

Determination (1-5a):

$$g1m1=g0m1+eTm1(=G1\times M1)<0$$

Determination (1-6a):

$$g2m2=g0m2-eTm2(=G2\times M2)>0$$

In this way, each of Function (1-2a) and Function (1-3a) is achieved by a configuration capable of performing one outer product operation, in other words, two multiplication processes times. In addition, each of Function (1-5a) and Function (1-6a) is achieved by a configuration capable of performing multiplication just one time. In other words, a process of evaluating presence/absence of polygonal line vertex coordinate data for each coordinate data in the input time series requires a circuit configuration capable of performing a total of six multiplication processes.

2.2 Configuration of Polygonal Line Approximating Unit

Figure 14:
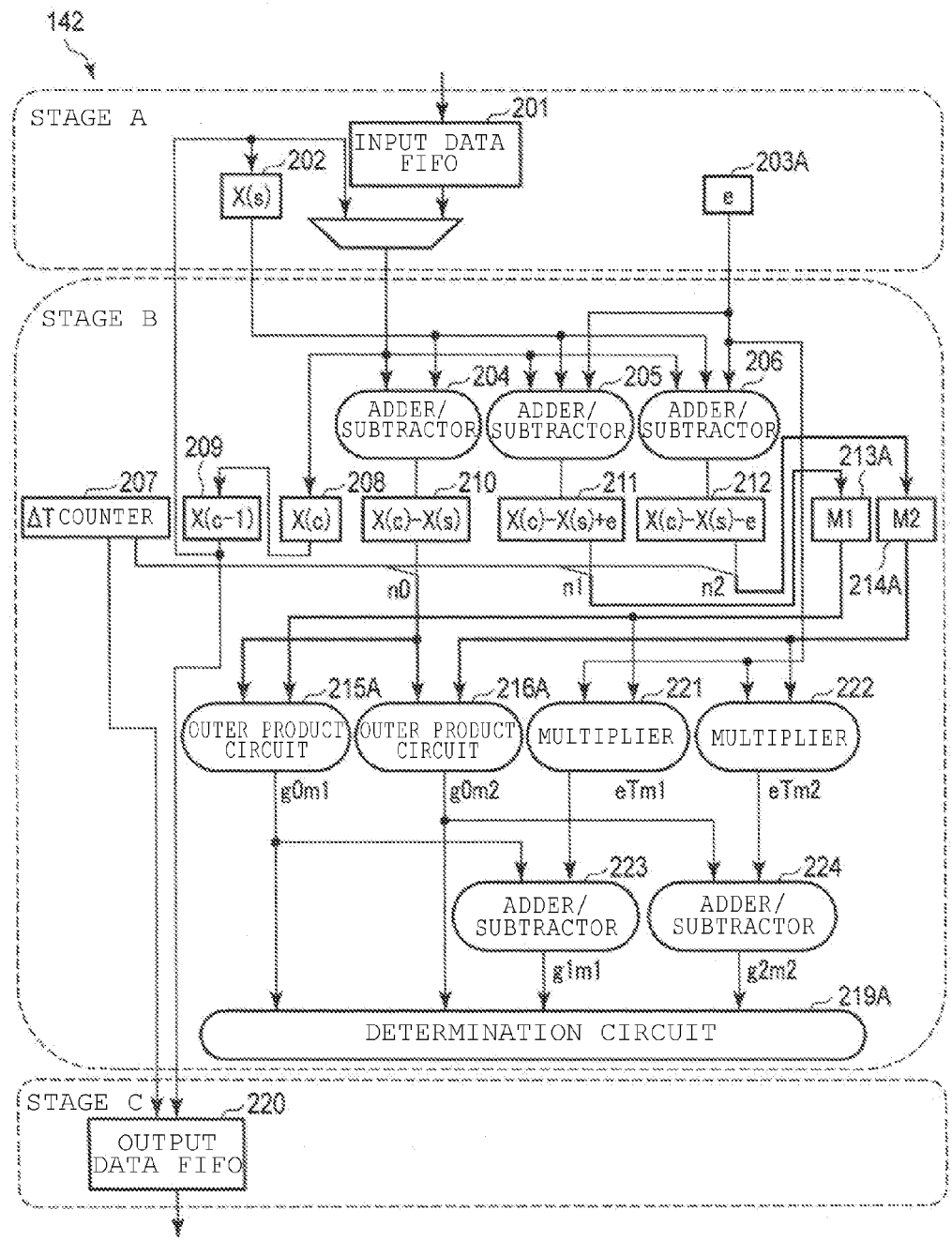
FIG. 14 is a circuit diagram that illustrates the configuration of a polygonal line approximating unit of a time series data compressing apparatus according to a second embodiment.

Next, the configuration of the polygonal line approximating unit of the time series data compressing apparatus according to the second embodiment will be described in detail with reference to FIG. 14. FIG. 14 is a circuit diagram that illustrates one example of the configuration of the polygonal line approximating unit of the time series data compressing apparatus according to the second embodiment.

As illustrated in FIG. 14, the polygonal line approximating unit 142 according to the second embodiment, similar to the polygonal line approximating unit 142 according to the first embodiment, includes: input data FIFO module 201; a register 202; adder/subtractor units 204 to 206; a ΔT counter 207; registers 208 to 212; and output data FIFO module 220. In addition, the polygonal line approximating unit 142 according to the second embodiment further includes: a register 203A, registers 213A and 214A, outer product circuits 215A and 216A, a determination circuit 219A, multiplier units 221 and 222; and adder/subtractor units 223 and 224.

The register 203A maintains an allowed error value e determined/stored in advance. The register 203A outputs the stored allowed error value e to the adder/subtractor units 204 to 206 and the multipliers 221 and 222.

A value (c−s) is transmitted from the ΔT counter 207 and a value (X(c)−X(s)) is transmitted from the register 210 and these values are input to a node n0. At the node n0, the input values are integrated as evaluation information G0=[X(c)−X(s), c−s] that is a vector of a homogeneous coordinate system, and the evaluation information is output to the outer product circuits 215A and 216A.

A value (c−s) transmitted from the ΔT counter 207 and a value (X(c)−X(s)+e) transmitted from the register 211 are input to a node n1. At the node n1, the input values are integrated as error upper limit information G1=[X(c)−X(s)+e, c−s] that is a vector of a homogeneous coordinate system. The error upper limit information G1 is output to the register 213A in a case where both results of Determination (1-2a) and Determination (1-3a) acquired by the determination circuit 219A are "Yes", and a result of Determination (1-5a) is "Yes".

A value (c−s) transmitted from the ΔT counter 207 and a value (X(c)−X(s)−e) transmitted from the register 212 are input to a node n2. At the node n2, the input values are integrated as error lower limit information G2=[X(c)−X(s)−e, c−s] that is a vector of a homogeneous coordinate system. The error lower limit information G2 is output to the register 214A in a case where both results of Determination (1-2a)

and Determination (1-3a) acquired by the determination circuit 219A are "Yes", and a result of Determination (1-6a) is "Yes".

The register 213A maintains determination upper limit information M1=[Xm1, Tm1]. The register 213A outputs the currently maintained determination upper limit information M1 to the outer product circuit 215A. In addition, the register 213A outputs the second component Tm1 of the determination upper limit information M1 to the multiplier 221.

More specifically, in a case where both the results of Determination (1-2a) and Determination (1-3a) acquired by the determination circuit 219A are "Yes", and the result of Determination (1-5a) is "Yes", the register 213A updates the stored determination upper limit information M1 with the error upper limit information G1 output from the node n1. On the other hand, in a case where one of the results of Determination (1-2a) and Determination (1-3a) acquired by the determination circuit 219A is "No", the register 213A updates the stored determination upper limit information M1 to be M1=[1, 0].

The register 214A maintains determination lower limit information M2=[Xm2, Tm2]. The register 214A outputs the currently stored determination lower limit information M2 to the outer product circuit 216A. In addition, the register 214A outputs the second component Tm2 of the determination lower limit information M2 to the multiplier 222.

More specifically, in a case where both the results of Determination (1-2a) and Determination (1-3a) acquired by the determination circuit 219A are "Yes", and the result of Determination (1-6a) is "Yes", the register 214A updates the currently stored determination lower limit information M2 with the error lower limit information G2 output from the node n2. On the other hand, in a case where one of the results of Determination (1-2a) and Determination (1-3a) acquired by the determination circuit 219A is "No", the register 214A updates the currently stored determination lower limit information M2 to be M2=[−1, 0].

The outer product circuit 215A receives the evaluation information G0 output from the node n0 and the determination upper limit information M1 output from the register 213 respectively as a first input vector and a second input vector and performs an outer product operation based on the first input vector and the second input vector. The outer product circuit 215A outputs an outer product value g0m1 of the evaluation information G0 and the determination upper limit information M1 as a result of the outer product operation to the adder/subtractor unit 223 and the determination circuit 219A.

The outer product circuit 216A receives the evaluation information G0 output from the node n0 and the determination lower limit information M2 output from the register 214 respectively as a first input vector and a second input vector and performs an outer product operation based on the first input vector and the second input vector. The outer product circuit 216A outputs an outer product value g0m2 of the evaluation information G0 and the determination lower limit information M2 as a result of the outer product operation to the adder/subtractor unit 224 and the determination circuit 219A.

The multiplier 221 receives the allowed error value e output from the register 203A and the second component Tm1 of the determination upper limit information M1 output from the register 213A respectively as a first input value and a second input value. The multiplier 221 multiplies the first input value by the second input value and outputs a value eTm1 to the determination circuit 219A.

The multiplier 222 receives the allowed error value e output from the register 203A and the second component Tm2 of the determination lower limit information M2 output from the register 214A respectively as a first input value and a second input value. The multiplier 222 multiplies the first input value by the second input value and outputs a value eTm2 to the determination circuit 219A.

The adder/subtractor unit 223 receives the value g0m1 output from the outer product circuit 215A and the value eTm1 output from the multiplier 221 respectively as a first input value and a second input value. The adder/subtractor unit 223 adds the second input value to the first input value and outputs a value g1m1=g0m1+eTm1 to the determination circuit 219A.

The adder/subtractor unit 224 receives the value g0m2 output from the outer product circuit 216A and the value eTm2 output from the multiplier 222 respectively as a first input value and a second input value. The adder/subtractor unit 224 subtracts the second input value from the first input value and outputs a value g2m2=g0m2−eTm2 to the determination circuit 219A.

The determination circuit 219A performs Determination (1-2a) based on the outer product value g0m1 input from the outer product circuit 215A. More specifically, in a case where the value g0m1 is negative (g0m1<0), the determination circuit 219A determines that the evaluation value is below the upper limit value of the slope for the polygonal line determination (the result of Determination (1-2a) is "Yes"). On the other hand, in a case where the value g0m1 is equal to or greater than zero (g0m1≥0), the determination circuit 219A determines that the evaluation value is above the upper limit value of the slope for the polygonal line determination (the result of Determination (1-2a) is "No"). The determination circuit 219A performs Determination (1-3a) based on the outer product value g0m2 input from the outer product circuit 216A. More specifically, in a case where the value g0m2 is positive (g0m2>0), the determination circuit 219A determines that the evaluation value is above the lower limit value of the slope for the polygonal line determination (the result of Determination (1-3a) is "Yes"). On the other hand, in a case where the value g0m2 is equal to or less than zero (g0m2≤0), the determination circuit 219A determines that the evaluation value is below the lower limit value of the slope for the polygonal line determination (the result of Determination (1-3a) is "No"). In other words, in a case where both results of Determination (1-2a) and Determination (1-3a) for the evaluation coordinates P(c) are "Yes", the determination circuit 219A determines that the coordinates P(c−1) of time (c−1) prior to the evaluation coordinates P(c) is not polygonal line vertex coordinate data. On the other hand, in a case where one of the result of Determination (1-2a) and the result of Determination (1-3a) for the evaluation coordinates P(c) is "No", the determination circuit 219A determines that the coordinate P(c−1) is polygonal line vertex coordinate data.

The determination circuit 219A performs Determination (1-5a) based on the value g1m1 input from the adder/subtractor unit 223. More specifically, in a case where the value g1m1 is negative (g1m1<0), the determination circuit 219A determines that the allowed error upper limit value of the evaluation value is below the upper limit value of the slope for the polygonal line determination (the result of Determination (1-5a) is "Yes"). On the other hand, in a case where the value g1m1 is equal to or greater than zero (g1m1≥0), the determination circuit 219A determines that the allowed error upper limit value of the evaluation value is above the upper limit value of the slope for the polygonal line determination (the result of Determination (1-5a) is "No"). In other words, the determination circuit 219A determines that the determination upper limit information M1 is to be updated with the error upper limit information G1 in a case where the result of Determination (1-5a) is "Yes" and determines that the determination upper limit information M1 is to be maintained in the current state in a case where the result of Determination (1-5a) is "No".

The determination circuit 219A performs Determination (1-6a) based on the value g2m2 input from the adder/subtractor unit 224. More specifically, in a case where the value g2m2 is positive (g2m2>0), the determination circuit 219A determines that the allowed error lower limit value of the evaluation value is above the lower limit value of the slope for the polygonal line determination (the result of Determination (1-6a) is "Yes"). On the other hand, in a case where the value g2m2 is equal to or less than zero (g2m2≤0), the determination circuit 219A determines that the allowed error lower limit value of the evaluation value is below the lower limit value of the slope for the polygonal line determination (the result of Determination (1-6a) is "No"). In other words, the determination circuit 219A determines that the determination lower limit information M2 is to be updated with the error lower limit information G2 in a case where the result of Determination (1-6a) is "Yes" and determines that the determination lower limit information M2 is to be maintained in the current state in a case where the result of Determination (1-6a) is "No".

Figure 15:
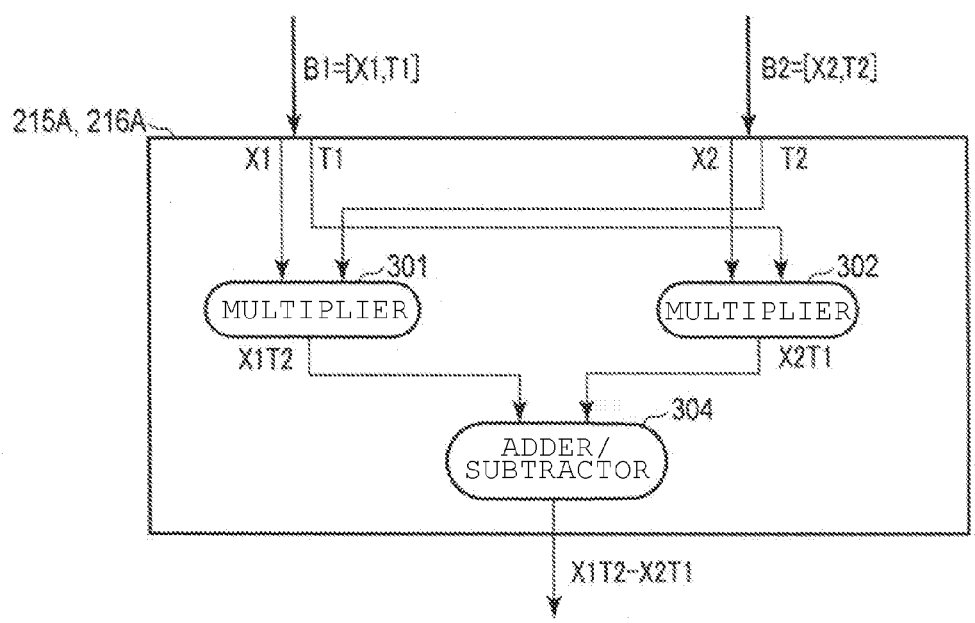
FIG. 15 is a circuit diagram that illustrates outer product circuits of the time series data compressing apparatus according to the second embodiment.

FIG. 15 is a circuit diagram that illustrates one example of the configuration of outer product circuits 215A and 216A of the time series data compressing apparatus according to the second embodiment. As illustrated in FIG. 15, the outer product circuits 215A and 216A can have the same configuration and, for example, include multipliers 301 and 302 and an adder/subtractor unit 304. In the example illustrated in FIG. 15, a case is illustrated as an example in which vectors B1=[X1, T1] and B2=[X2, T2] of a homogeneous coordinate system are input to the outer product circuits 215A and 216A respectively as a first input vector and a second input vector. The first input vector B1, for example, is the evaluation information G0. The second input vector B2, for example, is the determination upper limit information M1 or the determination lower limit information M2.

A first component X1 of the first input vector B1 and a second component T2 of the second input vector B2 are input to the multiplier 301 respectively as a first input value and a second input value. The multiplier 301 outputs a multiplication result X1T2 of the first input value X1 and the second input value T2 to the adder/subtractor unit 304.

A first component X2 of the second input vector B2 and a second component T1 of the first input vector B1 are input to the multiplier 302 respectively as a first input value and a second input value. The multiplier 302 outputs a multiplication result X2T1 of the first input value X2 and the second input value T1 to the adder/subtractor unit 304.

The adder/subtractor unit 304 performs subtraction based on the value X1T2 input from the multiplier 301 and the value X2T1 input from the multiplier 302 and outputs a value (X1T2−X2T1).

2.3 Operation at Time of Performing Polygonal Line Approximating Process

Figure 16:
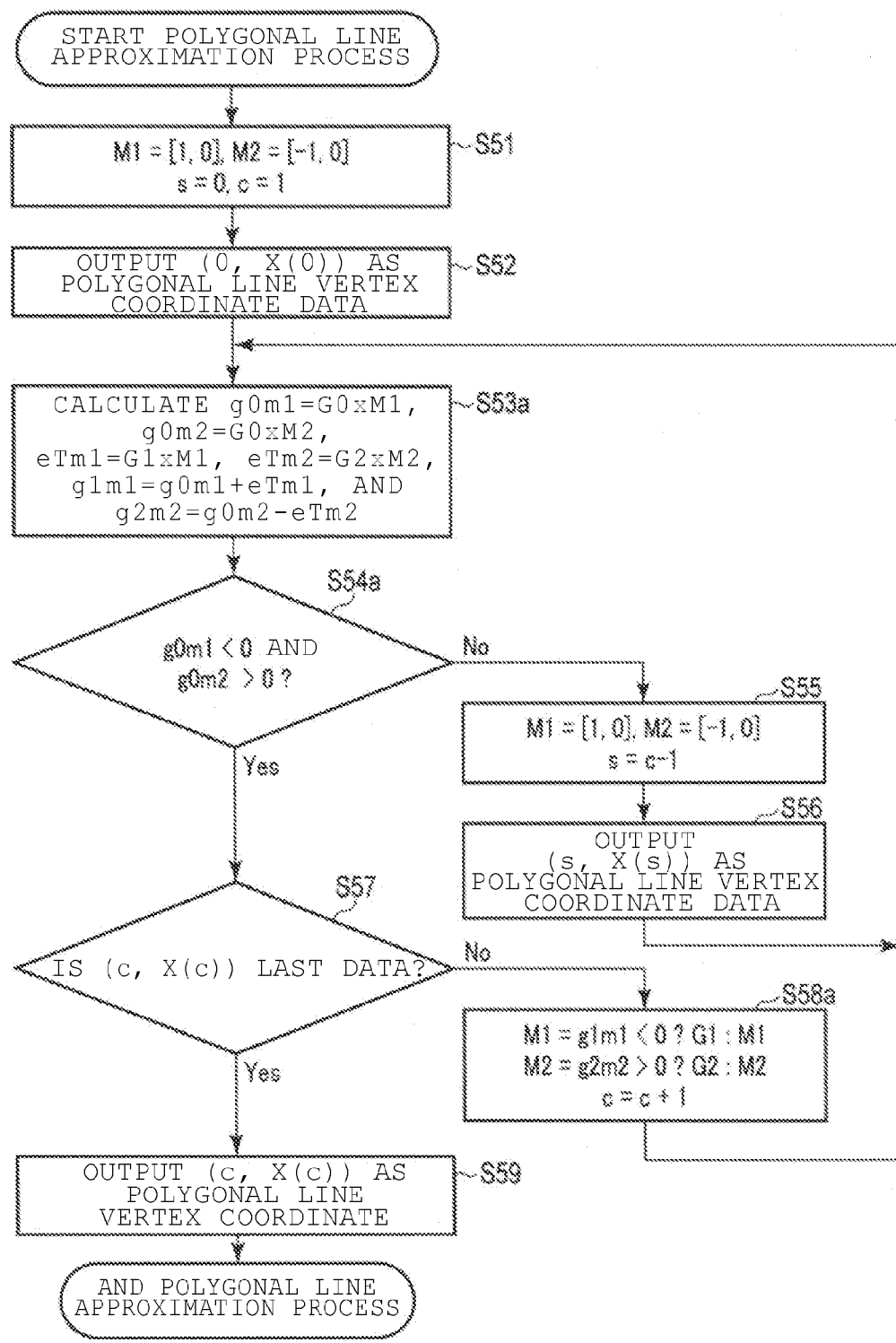
FIG. 16 is a flowchart that illustrates one example of an operation of the time series data compressing apparatus according to the second embodiment that is performed when a polygonal line approximating process is performed.

Next, an operation at the time of performing the polygonal line approximating process according to the second embodiment will be described with reference to FIG. 16. FIG. 16 is a flowchart that illustrates the operation of the time series data compressing apparatus according to the second embodiment performed at the time of performing the polygonal line approximating process. In description described below, it is assumed that a fixed value is used as the allowed error value "e".

As illustrated in FIG. 16, in Step S51, the polygonal line approximating unit 142 initializes values stored in the ΔT counter 207 and the registers 213A and 214A. In Step S52, the polygonal line approximating unit 142 outputs the first coordinates (0, X(0)) of the input time series data as polygonal line approximation coordinate data.

Step S51 corresponds to the operation for performing Function (1-1). Step S52 corresponds to an operation for performing Function (1-4). Specific operations of Step S51 and Step S52 are similar to those of the first embodiment, and additional description thereof will not be presented.

Subsequently, the polygonal line approximating unit 142 prepares to enter a loop process for determining whether each subsequent coordinate data in the input time series data is polygonal line vertex coordinate data. More specifically, the input data FIFO module 201 outputs the next sensor data X(1) (T=1) in the input time series data to the register 208 and the adder/subtractor units 204 to 206. The register 208 stores the received sensor data X(1). In addition, the register 202 outputs the stored sensor data X(0) to the adder/subtractor units 204 to 206. The register 203A outputs the allowed error value e to the adder/subtractor units 205 and 206 and the multipliers 221 and 222.

The adder/subtractor units 204 to 206 perform operations similar to those of the first embodiment.

In this manner, the preparation for entering the loop process is completed, and, in a subsequent process sequence, the loop processing is performed. In description presented below, the input data FIFO module 201 is assumed to output the sensor data X(c) of the evaluation coordinates Pc. The register 202 is assumed to store the sensor data X(s) of the reference coordinates Ps. The ΔT counter 207 is assumed to maintain the time data c and (c−1) and the value (c−s). The register 208 is assumed to store the sensor data X(c), and the register 209 is assumed to maintain the sensor data X(c−1). The registers 210 to 212 are assumed to respectively store values (X(c)−X(s)), (X(c)−X(s)+e), and (X(c)−X(s)−e). The register 213A is assumed to maintain the determination upper limit information M1=[Xm1, Tm1], and the register 214A is assumed to maintain the determination lower limit information M2=[Xm2, Tm2].

In Step S53a, the polygonal line approximating unit 142 simultaneously performs two outer product operations and two multiplication operations all in parallel with each other.

More specifically, the ΔT counter 207 respectively outputs the value (c−s) to the nodes n0 to n2. The register 210 outputs the value (X(c)−X(s)) to the node n0. The register 211 outputs the value (X(c)−X(s)+e) to the node n1. The register 212 outputs the value (X(c)−X(s)−e) to the node n2. The node n0 integrates the value (c−s) and the value (X(c)−X(s)) that have been received as evaluation information G0=[X(c)−X(s), c−s]. The node n1 integrates the value (c−s) and the value (X(c)−X(s)+e) that have been received as error upper limit information G1=[X(c)−X(s)+e, c−s]. The node n2 integrates the value (c−s) and the value (X(c)−X(s)−e) that have been received as error lower limit information G2=[X(c)−X(s)−e, c−s]. The register 213A outputs the determination upper limit information M1 to the outer product circuit 215A. In addition, the register 213A outputs the second component Tm1 of the determination upper limit information M1 to the multiplier 221. The register 214A outputs the determination lower limit information M2 to the outer product circuit 216A. In addition, the register 214A outputs the second component Tm2 of the determination lower limit information M2 to the multiplier 222.

The outer product circuit 215A performs an outer product operation G0×M1 based on the evaluation information G0 and the determination upper limit information M1 that have been received and then outputs the outer product value g0m1 to the determination circuit 219A and the adder/subtractor unit 223. The outer product circuit 216A performs an outer product operation G0×M2 based on the evaluation information G0 and the determination lower limit information M2 that have been received and outputs the outer product value g0m2 to the determination circuit 219A and the adder/subtractor unit 224. The multiplier 221 performs multiplication based on the allowed error value e and the second component Tm1 of the determination upper limit information M1 that have been received and outputs a value e·Tm1 to the adder/subtractor unit 223. The multiplier 222 performs multiplication based on the allowed error value e and the second component Tm2 of the determination lower limit information M2 that have been received and outputs a value e·Tm2 to the adder/subtractor unit 224. In other words, a total of six multiplication operations including two outer product operations (which include a total of four multiplication operations) performed by the outer product circuits 215A and 216A and two multiplication operations performed by the multipliers 221 and 222 are simultaneously performed.

The adder/subtractor unit 223 performs addition based on the value g0m1 and the value e·Tm1 that have been received and outputs a value g1m1 to the determination circuit 219A. The adder/subtractor unit 224 performs subtraction based on the value g0m2 and the value e·Tm2 that have been received and outputs a value g2m2 to the determination circuit 219A.

In Step S54a, the polygonal line approximating unit 142 performs Determination (1-2a) and Determination (1-3a). More specifically, the determination circuit 219A determines whether the received value g0m1 is negative (g0m1<0). In addition, the determination circuit 219A determines whether the received value g0m2 is positive (g0m2>0). In a case where it is determined that both g0m1<0 and g0m2>0 (Step S54a: Yes), the determination circuit 219A determines that a polygonal line vertex is not present between the reference coordinates Ps and the evaluation coordinates Pc, and the process proceeds to Step S57. On the other hand, in a case where it is determined that either g0m1≥0 or g0m2≤0 (Step S54a: No), the determination circuit 219A determines that a polygonal line vertex is present between the reference coordinates Ps and the evaluation coordinates Pc, and the process proceeds to Step S55.

Step S53a and Step S54a respectively correspond to operations for performing Function (1-2) and Function (1-3).

In Step S55, the polygonal line approximating unit 142 performs initialization for setting the coordinates P(c−1) to new reference coordinates Ps based on the results of Determination (1-2a) and Determination (1-3a). In Step S56, the polygonal line approximating unit 142 outputs the coordinates P(c−1) as polygonal line vertex coordinate data. Thereafter, the polygonal line approximating unit 142 returns to Step S53a.

Step S55 corresponds to an operation for performing Function (1-1). Step S56 corresponds to an operation for performing Function (1-4). Details of the operations of Step S55 and Step S56 are similar to those of the first embodiment, and thus further description thereof will not be presented.

In Step S57, the polygonal line approximating unit 142 determines whether the sensor data X(c) is the last data in the input time series data. More specifically, in a case where there is no time series data left to be output from the input data FIFO module 201, the polygonal line approximating unit 142 determines that the sensor data X(c) maintained in the register 208 is the last data (Step S57: Yes), and the process proceeds to Step S59. On the other hand, in a case where there is still data to be output from input data FIFO module 201, the determination circuit 219 determines that the sensor data X(c) maintained in the register 208 is not the last data (Step S57: No), and the process proceeds to Step S58a.

In Step S58a, the polygonal line approximating unit 142 performs Determination (1-5a) and Determination (1-6a).

More specifically, the determination circuit 219A determines whether the received value g1m1 is negative (g1m1<0). In addition, the determination circuit 219A determines whether the received value g2m2 is positive (g2m2>0).

In a case where it is determined that g1m1<0 as a result of Determination (1-5a), the determination circuit 219A updates the determination upper limit information M1 maintained in the register 213A with the error upper limit information G1 output from the node n1. On the other hand, in a case where it is determined that g1m1≥0, the determination circuit 219A continues to maintain the currently stored determination upper limit information M1 in the register 213A.

In addition, in a case where it is determined that g2m2>0 as a result of Determination (1-6a), the determination circuit 219A updates the determination lower limit information M2 maintained in the register 214A with the error lower limit information G2 output from the node n2. On the other hand, in a case where it is determined that g2m2≤0, the determination circuit 219A continues to maintain the currently stored determination lower limit information M2 in the register 214A.

The ΔT counter 207 counts up the values of the time data c and (c−1) and the value (c−s) that by one.

Thereafter, the polygonal line approximating unit 142 returns to Step S53a.

Step S58a corresponds to an operation for performing Function (1-5), Function (1-6), and Function (1-7).

In Step S59, the polygonal line approximating unit 142 outputs the coordinate data (c, X(c)) determined to be the last data in the input time series data to the data buffer 143 as polygonal line vertex coordinate data.

Step S59 corresponds to an operation for performing Function (1-4). Details of the operation of Step S59 are similar to those of the first embodiment, and thus description thereof will not be further presented.

As above, the polygonal line approximating operation ends.

2.4 Effect Relating to this Embodiment

According to the configuration of the second embodiment, the polygonal line approximating unit 142 includes the outer product circuits 215A and 216A. In addition, the polygonal line approximating unit 142 includes the multipliers 221 and 222. The outer product circuit 215A outputs the value g0m1 of G0×M1, and the outer product circuit 216A outputs the value g0m2 of G0×M2. The multiplier 221 outputs the value e·Tm1 of the product of the allowed error value e and the second component Tm1 of the determination upper limit information M1, and the multiplier 222 outputs the value e·Tm2 of the product of the allowed error value e and the second component Tm2 of the determination lower limit information M2. The outer product circuits 215A and 216A and the multipliers 221 and 222 are connected in parallel for simultaneous operations in the polygonal line approximating process. Accordingly, the circuit scale can be further decreased more than that of the first embodiment.

Furthermore, according to the configuration of the first embodiment, Function (1-1) to Function (1-7) are achieved by performing multiplication of eight times by including the outer product circuits 215 to 218. In the multiplication of eight times, a duplicated operation is included. For this reason, by omitting the duplicated operation, the number of times of multiplication can be further decreased. In this way, according to the configuration of the second embodiment, by performing multiplication operation six times, an equivalent result can be achieved. Thus, the number of required multipliers can be decreased by two. Therefore, the circuit scale can be further decreased.

3. Modified Examples

The present disclosure is not limited to the first embodiment and the second embodiment described above, and various modifications can be made. For example, in the first embodiment and the second embodiment, an example has been described in which the homogeneous coordinate system is applied to the polygonal line approximation algorithm based on reference #1. However, the present disclosure is not limited to this algorithm and effects similar to those of the first embodiment and the second embodiment can be acquired by applying a homogeneous coordinate system to any other polygonal line approximation algorithm. As an example of such a case, for example, there is an example in which an algorithm from another literature reference a (reference #2) is used instead of the algorithm of reference #1. Reference #2 is: Tomek I., "Two algorithm for piecewise linear continuous approximation of functions of one variable", IEEE Trans. Comput., C-23, t, pp. 445-448, April 1974, and is incorporated herein by reference in its entirety with regard to linear approximation methods and the like.

As described above, in the reference #1 by adding/subtracting the allowed error value e to/from the sensor data X(c) of the evaluation coordinates Pc (c, X(c)), the error upper limit information G1 and the error lower limit information G2 are calculated. On the other hand, in the reference #2, the error upper limit information G1 and the error lower limit information G2 are calculated by adding/subtracting the allowed error value e to/from the sensor data X(s) of the reference coordinates Ps (s, X(s)), which is different from the process of reference #1. However, also in the technique of the reference #2, the relation between slopes is evaluated based on the evaluation information G0, the error upper limit information G1, and the error lower limit information G2, which is similar to the technique in reference #1 Accordingly, in the first embodiment and the second embodiment, a polygonal line approximation algorithm based on the reference #2 can be applied instead of one based on the reference #1.

Figure 17:
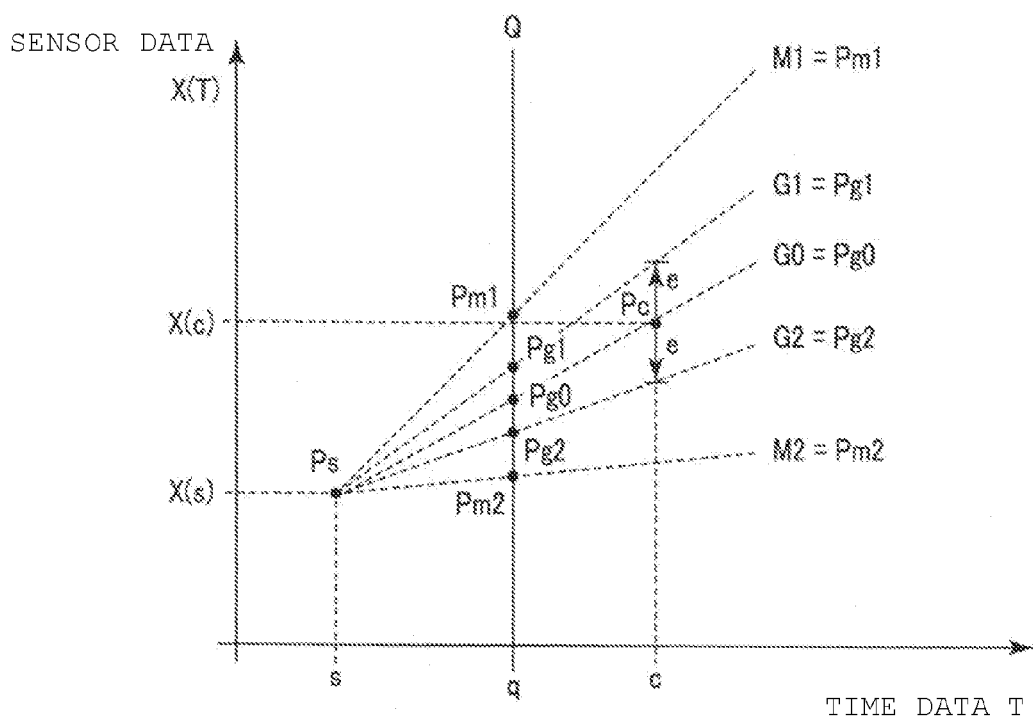
FIG. 17 is a schematic diagram that illustrates a polygonal line vertex coordinates determining function of the time series data compressing apparatus according to a modified example of the first embodiment.

In addition, in the first embodiment and the second embodiment, an example has been described in which information represented by the evaluation information G0 is the slope of a straight line. However, the evaluation information G0 is not limited to being the slope of a straight line but may be defined based on any other value. For example, as illustrated in FIG. 17, the evaluation information G0 may be a value of the X coordinate of an intersection Pg0 between a certain straight line (for example, a straight line parallel to the sensor data X(T) axis) Q:T=q and a straight line joining the reference coordinates Ps and the evaluation coordinates Pc. In accordance with this, the error upper limit information G1, the error lower limit information G2, the determination upper limit information M1, and the determination lower limit information M2 respectively represent X coordinates of points Pg1, Pg2, Pm1 and Pm2 illustrated in FIG. 17. In such a case, the evaluation information G0, the error upper limit information G1, the error lower limit information G2, the determination upper limit information M1, and the determination lower limit information M2 are values acquired by multiplying the slopes of the straight lines by a common coefficient. Accordingly, in this modified example, an operation load is substantially the same as that of the case where the information represented by the evaluation information G0 is the slope of a straight line, and effects similar to those of the first embodiment and the second embodiment can be acquired.

In addition, as the evaluation information G0, the error upper limit information G1, the error lower limit information G2, the determination upper limit information M1, and the determination lower limit information M2, values acquired by multiplying the results in a range in which the signs of the outer product operations G0×M1, G0×M2, G1×M1, and G2×M2 are not changed may be defined.

More specifically, for example, in a case where the outer product operation G0×M1 is performed, also in a case where the homogeneous coordinate component of the evaluation information G0 is defined as G0=[k(X(c)−X(s)), (c−s)] (here, k is a positive real number), and the homogeneous coordinate component of the determination upper limit information M1 is defined as M1=[kXm1, Tm1], the sign of the outer product operation G0×M1 does not change. In this way, the values input to the multipliers 301 and 302 may not directly represent the slopes of segments between coordinate data included inside the time series data in a range in which the sign of the outer product operation does not qualitatively change.

In addition, for example, also in a case where the homogeneous coordinate component of the evaluation information G0 is defined as G0=[N(X(c)−X(s)), N(c−s)] (here, N is an arbitrary integer), the sign of the outer product operation G0×M1 does not change. In this way, the values input to the multipliers 301 and 302 may not be values of the coordinate data included inside the time series data in a range in which the sign of the outer product operation does not qualitatively change.

An example has been described in which the polygonal line approximating unit 142 uses the homogeneous coordinate system when the polygonal line approximating process is performed. However, the polygonal line approximating unit 142 is not limited to the homogeneous coordinate system but may perform the polygonal line approximating process using a vector representation according to various coordinate systems. For example, the evaluation information G0, the error upper limit information G1, the error lower limit information G2, the determination upper limit information M1, and the determination lower limit information M2 may be defined as two-dimensional vectors in a coordinate system in which information representing a slope α=x/t is represented as a vector [t, x] having a first element as a denominator t and having a second element as a numerator x. In such a case, in determinations according to Function (1-2), Function (1-3), Function (1-5), and Function (1-6), the signs according to the comparisons are inverted.

In this way, each of the evaluation information G0, the error upper limit information G1, the error lower limit information G2, the determination upper limit information M1, and the determination lower limit information M2 input to the multipliers includes a set of a value calculated based on a difference between the time data T included in the time series data and a value calculated based on a difference between the sensor data X(T). However, the set of values may be variously changed.

In addition, the time series data compressing apparatus 10 has been described as storing coding tables in the storage unit 144 disposed inside the data compressing circuit 14 as an example but the disclosed apparatus is not limited thereto. For example, coding tables may be stored in the system memory 13. In such a case, the coding unit 145 reads the coding tables stored in the system memory 13 through the communication unit 141 when the coding process is performed. In addition, in another example, the coding tables may not be stored in a memory but rather be incorporated into the variable-length coding circuit 403 in advance for direct calculation.

Furthermore, while an example in which one sensor 30 is connected to one time series data compressing apparatus 10 has been described, the present disclosure is not limited thereto. Thus, a plurality of sensors 30 may in fact be connected to one time series data compressing apparatus 10. In such a case, the plurality of sensors 30 may independently write time series data generated by the respective sensors 30 to the system memory 13.

In addition, while an example in which the flash memory 20 and the sensor 30 are included in the IoT apparatus 3 has been described, the present disclosure is not limited thereto. Thus, the flash memory 20 and/or the sensor 30 may be externally attached to the IoT apparatus 3 in some embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data compressing apparatus, comprising:
    a polygonal line approximating circuit configured to receive first time series data and output second time series data by performing a polygonal line approximation process on the first time series data, wherein the polygonal line approximating circuit includes:
    a first multiplier and a second multiplier each receiving a first value that is a difference between a time value component of first data in the first time series data and a time value component of second data in the first time series data and respectively multiply the first value by another value corresponding to a determination slope limit for the polygonal line approximation process; and
    a third multiplier and a fourth multiplier each receiving a second value that is a difference between a sensor value component of the first data and a sensor value component of the second data and respectively multiply the second value by another value corresponding to the determination slope limit for the polygonal line approximation process.

2. The data compressing apparatus according to claim 1, wherein the polygonal line approximating circuit further includes:
    a fifth multiplier and a sixth multiplier each receiving the first value and respectively multiplying the first value by another value corresponding to the determination slope limit for the polygonal line approximation process;
    a seventh multiplier receiving a third value that is a sum of the second value and an acceptable error value; and
    an eighth multiplier receiving a fourth value that is difference between the second value and the acceptable error value.

3. The data compressing apparatus according to claim 1, wherein the polygonal line approximating circuit further includes a ninth multiplier and a tenth multiplier performing multiplication having the acceptable error value as input.

4. The data compressing apparatus according to claim 1, wherein the first to fourth multipliers are connected in parallel with each other.

5. The data compressing apparatus according to claim 1, wherein the first value is an integer value.

6. The data compressing apparatus according to claim 1, further comprising:
    a coding circuit configured to perform a variable-length coding process on the second time series data according to a predetermined coding table.

7. The data compressing apparatus according to claim 6, wherein the coding circuit further includes:
    a selector module configured to calculate code lengths for resultant coded data resulting from the variable-length coding process based on each of a plurality of predetermined coding tables; and
    a variable-length coding circuit configured to perform a variable-length coding process based on the predetermined coding tables selected from the plurality of predetermined coding tables on the basis of coded length of the resultant coded data.

8. A network-connectable device, comprising:
    a sensor circuit configured to output sensor readings as first time series data; and
    a time series data compressing apparatus configured to perform a polygonal line approximation process on the first time series data to generate second time series data, the time series data compressing apparatus including a polygonal line approximating circuit having:
    a first multiplier and a second multiplier each receiving a first value that is a difference between a time value component of first data in the first time series data and a time value component of second data in the first time series data and respectively multiply the first value by another value corresponding to a determination slope limit for the polygonal line approximation process; and
    a third multiplier and a fourth multiplier each receiving a second value that is a difference between a sensor value component of the first data and a sensor value component of the second data and respectively multiply the second value by another value corresponding to the determination slope limit for the polygonal line approximation process.

9. The network-connectable device according to claim 8, wherein the polygonal line approximating circuit further includes:
    a fifth multiplier and a sixth multiplier each receiving the first value and respectively multiplying the first value by another value corresponding to the determination slope limit for the polygonal line approximation process;

a seventh multiplier receiving a third value that is a sum of the second value and an acceptable error value; and an eighth multiplier receiving a fourth value that is difference between the second value and the acceptable error value.

10. The network-connectable device according to claim 8, wherein the polygonal line approximating circuit further includes a ninth multiplier and a tenth multiplier performing multiplication having the acceptable error value as input.

11. The network-connectable device according to claim 8, wherein the first to fourth multipliers are connected in parallel with each other.

12. The network-connectable device according to claim 8, wherein the first value is an integer value.

13. The network-connectable device according to claim 8, further comprising:

a coding circuit configured to perform a variable-length coding process on the second time series data according to a predetermined coding table.

14. The network-connectable device according to claim 13, wherein the coding circuit further includes:

a selector module configured to calculate code lengths for resultant coded data resulting from the variable-length coding process based on each of a plurality of predetermined coding tables; and a variable-length coding circuit configured to perform a variable-length coding process based on the predetermined coding tables selected from the plurality of predetermined coding tables on the basis of coded length of the resultant coded data.

15. The network-connectable device according to claim 8, wherein the sensor circuit includes a sensor outputting the sensor readings.

16. The network-connectable device according to claim 8, wherein the polygonal line approximating circuit has a three-stage pipeline structure.

17. A data compressing apparatus, comprising:

a polygonal line approximating circuit configured to receive a first time series data from a sensor and apply a polygonal line approximation to the first time series data and extract polygonal line vertex coordinate data from the first time series data and output the extracted polygonal line vertex coordinate data as a second time series data, the polygonal line approximating circuit including:

a first input data first-in-first out buffer to receive and store the first time series data in sequence;

a first register in which a first sensor reading at a first time index value in the first time series data is to be stored;

a second register in which an acceptable error value to be used in the polygonal line approximation is stored;

a first adder-subtractor circuit configured to output a first value that is calculated as a difference between the first sensor reading and a second sensor reading, the second sensor reading be at a second time index value corresponding to a time before the first time index value;

a second adder-subtractor circuit configured to output a second value that is calculated as the acceptable error value added to the difference between the first sensor reading and the second sensor reading;

a third adder-subtractor circuit configured to output a third value that is calculated as the acceptable error value subtracted from the difference between the first sensor reading and the second sensor reading;

a time difference counter configured to output a fourth value calculated as a difference between the first time index value and the second time index value;

a third register configured to store a first vector corresponding to a maximum permissible slope for determination of a polygonal line between first and second coordinates of the first time series data;

a fourth register configured to store a second vector corresponding to a minimum permissible slope for determination of the polygonal line between the first and second coordinates of the first time series data;

a first outer product circuit configured to perform an outer product operation on a third vector and the first vector, the third vector having a first coordinate value equal to the first value and a second coordinate value equal to the fourth value;

a second outer product circuit configured to perform an outer product operation on the third vector and the second vector; and a first output data first-in-first out buffer to receive and store extracted polygonal line vertex coordinates in sequence, wherein the first and second outer product circuits each comprise a first multiplier unit and a second multiplier unit connected in parallel, and the first and second outer product circuits are connected in parallel with each other.

18. The data compressing apparatus according to claim 17, wherein the polygonal line approximating circuit further includes:

a third outer product circuit configured to perform an outer product on operation on a fourth vector and the first vector, the fourth vector having a first coordinate value equal to the second value and a second coordinate value equal to the fourth value; and a fourth outer product circuit configured to perform an outer product on operation on a fifth vector and the second vector, the fifth vector having a first coordinate value equal to the third value and a second coordinate value equal to the fourth value, wherein the third and fourth outer product circuits each comprise a first multiplier unit and a second multiplier unit connected in parallel, and the first, second, third, and fourth outer products circuits are connected in parallel with each other.

19. The data compressing apparatus according to claim 17, wherein the polygonal line approximating circuit further includes:

a third multiplier unit configured to multiply the acceptable error value by a time coordinate value of the first vector;

a fourth multiplier unit configured to multiply the acceptable error value by a time coordinate value of the second vector, wherein the first and second outer product circuits are connected in parallel with the third and fourth multiplier units.

20. The data compressing apparatus according to claim 17, further comprising:

a coding circuit configured to perform a variable-length coding process on the second time series data according to a predetermined coding table.

* * * * *